(12) United States Patent
Al-Amri

(10) Patent No.: US 12,477,859 B2
(45) Date of Patent: *Nov. 18, 2025

(54) HIGH-CONCENTRATING PHOTOVOLTAIC SYSTEM WITH BACKPLATE SUPPORT

(71) Applicant: Imam Abdulrahman Bin Faisal University, Dammam (SA)

(72) Inventor: Fahad Gallab Al-Amri, Dammam (SA)

(73) Assignee: Imam Abdulrahman Bin Faisal University, Dammam (SA)

( * ) Notice: Subject to any disclaimer, the term of this patent is extended or adjusted under 35 U.S.C. 154(b) by 0 days.

This patent is subject to a terminal disclaimer.

(21) Appl. No.: 18/906,809

(22) Filed: Oct. 4, 2024

(65) Prior Publication Data

US 2025/0031483 A1 Jan. 23, 2025

Related U.S. Application Data

(63) Continuation of application No. 18/787,003, filed on Jul. 29, 2024, now Pat. No. 12,142,703, which is a
(Continued)

(51) Int. Cl.
*H10F 77/42* (2025.01)
*H10F 10/142* (2025.01)
(Continued)

(52) U.S. Cl.
CPC ......... *H10F 77/484* (2025.01); *H10F 10/142* (2025.01); *H10F 19/904* (2025.01); *H10F 77/488* (2025.01); *H10F 77/63* (2025.01)

(58) Field of Classification Search
CPC .......... H10F 77/60; H10F 77/63; H10F 77/40; H10F 77/42; H10F 77/484; H02S 40/22
See application file for complete search history.

(56) References Cited

U.S. PATENT DOCUMENTS

2009/0133737 A1 5/2009 Anzawa
2009/0277493 A1 11/2009 Merkle
(Continued)

FOREIGN PATENT DOCUMENTS

CN 109039265 A 12/2018
WO 2019/208716 A1 10/2019

OTHER PUBLICATIONS

Aeroglaze R polyurethane characteristics retrieved from https://www.matweb.com/search/datasheet_print.aspx?matguid=2500c0f4979b49d5a1e46df858db9ab3 on Oct. 18, 2023.
(Continued)

*Primary Examiner* — Christina Chern
(74) *Attorney, Agent, or Firm* — Oblon, McClelland, Maier & Neustadt, L.L.P.

(57) ABSTRACT

The HCPV system includes a plurality of modules connected to an array, a casing, a plurality of inverted pyramids, a plurality of solar cells, and a backplate. Each module includes an optical component that concentrates light onto a single solar cell and a single inverted pyramid with solid lateral faces connects the optical component at a peripheral edge of a base of the pyramid to the single solar cell at an apex of the inverted pyramid. The casing has a top frame and a bottom frame. The top frame surrounds each optical component on the peripheral edge of the pyramid, and the bottom frame surrounds each solar cell on the apex of the pyramid. The top frame and bottom frame are separated by a plurality of supports. The backplate is a plurality of interconnected circular pads.

19 Claims, 24 Drawing Sheets

Related U.S. Application Data continuation of application No. 17/835,555, filed on Jun. 8, 2022, now Pat. No. 12,094,993.

(51) Int. Cl.
  *H10F 19/90* (2025.01)
  *H10F 77/63* (2025.01)

(56) References Cited

U.S. PATENT DOCUMENTS

| | | |
|---|---|---|
| 2011/0186129 A1 | 8/2011 | Gombert |
| 2012/0145221 A1 | 6/2012 | Ozaki |
| 2014/0130845 A1 | 5/2014 | Ohki |

OTHER PUBLICATIONS

Wu et al. "Optical efficiency and performance optimization of a two-stage secondary reflection hyperbolic solar concentrator using machine learning", Renewable Energy 188 (2022) 437-449.

Emissivity Table for Infrared THermometer Readings retrieved from https://ennologic.com/wp-content/uploads/2018/07/Ultimate-Emissivity-Table.pdf on Oct. 18, 2023.

Himer et al. ("Performance analysis of non-imaging Fresnel lens as a primary stage for CPV units"), IOP Conf. Series: Earth and Environmental Science 161 (2018) 012029.

HIGH-CONCENTRATING PHOTOVOLTAIC SYSTEM WITH BACKPLATE SUPPORT

STATEMENT OF PRIOR DISCLOSURE BY THE INVENTOR

Aspects of the present disclosure are described in F. Al-Amri; "Optimum heat spreader size for producing maximum net power from high-concentration photovoltaic systems"; Jun. 27, 2021; The Institution of Engineering and Technology Renewable Power Generation, incorporated herein by reference in its entirety.

CROSS-REFERENCE TO RELATED APPLICATIONS

The present application is a Continuation of U.S. application Ser. No. 18/787,003, now allowed, having a filing date of Jul. 29, 2024, which is a Continuation of U.S. application Ser. No. 17/835,555, now U.S. Pat. No. 12,094,993, having a filing date of Jun. 8, 2022.

BACKGROUND

Technical Field

The present disclosure is directed to a high-concentrating photovoltaic (HCPV) system.

Description of Related Art

The "background" description provided herein is for the purpose of generally presenting the context of the disclosure. Work of the presently named inventors, to the extent it is described in this background section, as well as aspects of the description which may not otherwise qualify as prior art at the time of filing, are neither expressly or impliedly admitted as prior art against the present invention.

With global population growth energy demand is increasing to meet basic needs. There are two sources of energy, i.e., one is renewable energy sources, and the other is non-renewable energy sources (such as fossil fuels). The use of non-renewable energy sources causes problems such as environmental pollution and the depletion of the source itself. Therefore, presently, renewable energy sources are preferable over non-renewable energy sources and have become a mainstream of development. Presently, renewable energy sources such as solar energy are an alternative energy source to fossil fuels. Solar energy is preferred due to its clean and renewable nature, and further has the potential to fulfill global carbon emission-reduction agreements.

Solar energy may be converted into electrical energy using a photovoltaic (PV) system. To increase the efficiency of the PV system, high concentrator photovoltaic (HCPV) technology is employed. The HCPV technology uses optical devices such as lenses or curved mirrors to concentrate a large amount of sunlight onto a small area of solar photovoltaic (PV) cells to generate electrical power. The HCPV aims to reduce the cell surface area of the PV system and the cost of electricity. The HCPV technology lowers the number of required PV cells that are needed to generate equivalent electrical power.

Nonetheless, the HCPV system is still more expensive than a flat-plate PV system since the HCPV system needs two additional components. The first component is a tracking system that is required to track the sun and concentrate the sunlight accordingly. The second component is a cooling system to dissipate excess heat resulting from the direct and high amount of illumination concentrated into a small solar cell area. The tracking and the cooling systems add additional capital, operational costs, weight, and size to the existing PV system.

Accordingly, it is one object of the present disclosure to provide a HCPV system that is more efficient and can generate electricity in a cost-efficient manner.

SUMMARY

In an exemplary embodiment, a high-concentrating photovoltaic (HCPV) system is disclosed. The system includes a plurality of modules connected to form a module array, a casing, a plurality of inverted pyramids, a plurality of solar cells; and a backplate array. Each module includes one inverted pyramid of the plurality of inverted pyramids, one solar cell of the plurality of solar cells, and an optical component that concentrates light onto a corresponding solar cell of the plurality of solar cells. Each inverted pyramid has solid lateral faces and connects the optical component at a peripheral edge of a base of the pyramid to a corresponding solar cell of the plurality of solar cells at an apex of the inverted pyramid. The casing has a top frame and a bottom frame; wherein: the top frame surrounds the array at its periphery; and the bottom frame surrounds the array at its periphery. The top frame and bottom frame are connected by a plurality of supports. The backplate array is a plurality of interconnected circular pads. Each interconnected pad has a corresponding solar cell arranged in a center portion of the pad. The plurality of circular pads is interconnected by a grid structure. The grid structure connects the plurality of circular pads to the bottom frame. Each of the solar cells is adiabatically separated from one another.

In some embodiments, each solar cell of the plurality of solar cells is a triple-junction solar cell.

In some embodiments, each triple-junction solar cell has a length and a width of 5 mm to 10 mm.

In some embodiments, each triple-junction solar cell has a length and a width of 1 mm to 5 mm.

In some embodiments, the optical component is a Fresnel lens.

In some embodiments, each Fresnel lens has a length and a width of at least 200 mm.

In some embodiments, the number of the plurality of solar cells is at least 25 and there are at least 5 solar cells in a row on the array.

In some embodiments, the number of the plurality of inverted pyramids is at least 25.

In some embodiments, the number of the plurality of interconnected circular pads is at least 25.

In some embodiments, a thickness of a singular interconnected circular pad is 1 mm to 5 mm.

In some embodiments, a thickness of a singular interconnected circular pad is 5 mm to 10 mm.

In some embodiments, each Fresnel lens has a thermal coating layer.

In some embodiments, an emissivity of the thermal coating layer is 0.9 to 0.97.

In some embodiments, an emissivity of the thermal coating layer is 0.5 to 0.6.

In some embodiments, a length of an interconnected circular pad of the backplate array is 0.02 m to 0.06 m.

In some embodiments, a ratio of the length of an interconnected circular pad of the backplate array to half a length of a corresponding Fresnel lens is 0.6 to 0.7.

In some embodiments, a ratio of the length of an interconnected circular pad of the backplate array to half a length of a corresponding Fresnel lens is 0.7 to 0.8.

In some embodiments, an interconnected circular pad of the backplate array has a thermal conductivity of 200 W/mK to 225 W/mK.

In some embodiments, each Fresnel lens has an optical efficiency of from 0.8 to 0.9.

In some embodiments, the backplate array is in a shape of a square.

The foregoing general description of the illustrative embodiments and the following detailed description thereof are merely exemplary aspects of the teachings of this disclosure and are not restrictive.

BRIEF DESCRIPTION OF THE DRAWINGS

A more complete appreciation of this disclosure and many of the attendant advantages thereof will be readily obtained as the same becomes better understood by reference to the following detailed description when considered in connection with the accompanying drawings, wherein.

DETAILED DESCRIPTION

Figure 1A:
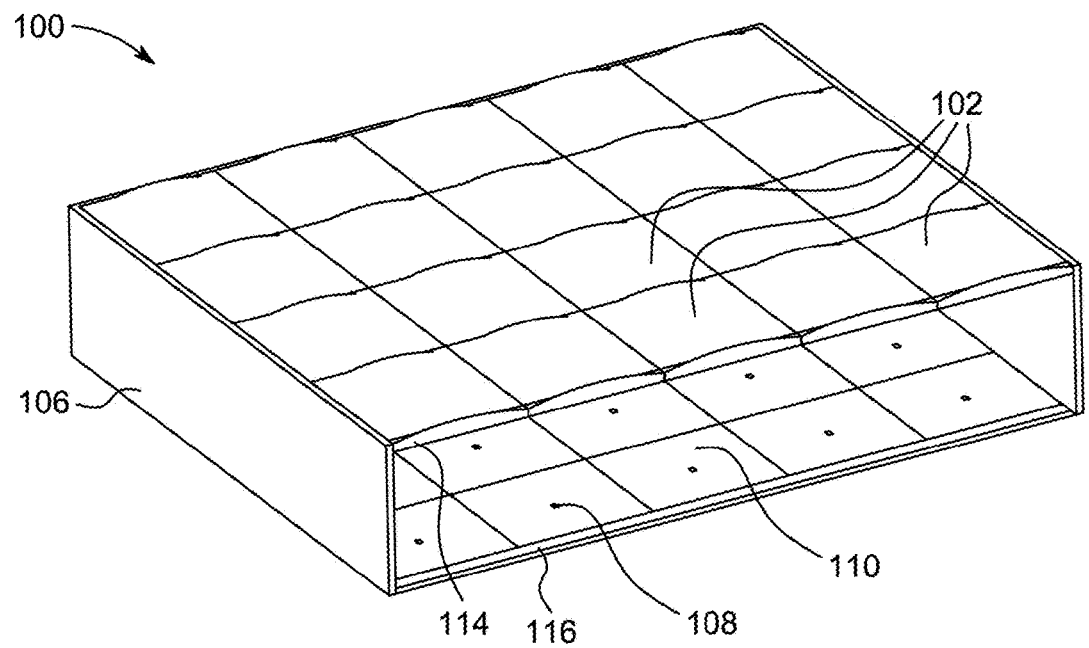
FIG. 1A illustrates a high-concentrating photovoltaic (HCPV) system.

In the drawings, like reference numerals designate identical or corresponding parts throughout the several views. Further, as used herein, the words "a," "an" and the like generally carry a meaning of "one or more," unless stated otherwise.

Furthermore, the terms "approximately," "approximate," "about," and similar terms generally refer to ranges that include the identified value within a margin of 20%, 10%, or preferably 5%, and any values therebetween.

Aspects of this disclosure are directed to a high-concentrating photovoltaic (HCPV) system. The present disclosure provides an HCPV system having fewer components and improved efficiency. The present disclosure provides a design of the HCPV system that can achieve higher efficiencies with lower energy demand and manufacturing costs, resulting in lower initial installation costs with increased efficiency. In an aspect, the present disclosure provides an analytical model to identify operating conditions to generate a net power of the HCPV system considering the effect of wind speed and backplate pad length on the produced power from solar cells and the consumed power by a tracking system. Further, the HCPV may have an arrangement to reduce power consumed by the tracking system. The present disclosure describes a HCPV with a heat spreader (backplate pad) at which the HCPV system is configured to produce maximum net power.

In various aspects of the disclosure, non-limiting definitions of one or more terms that will be used in the document are provided below.

The term "Fresnel lens" refers to an optical device having a succession of concentric rings, each consisting of an element of a simple lens, assembled in proper relationship on a flat surface to provide a short focal length compared to a large diameter. In some embodiments, the diameter to length ratio ranges from 1000:1 to 2:1, preferably 900:1 to 25:1, preferably 800:1 to 50:1, preferably 700:1 to 75:1, preferably 600:1 to 100:1, preferably 500:1 to 200:1, preferably 400:1 to 300:1, or 350:1. The Fresnel lens reduces the amount of material required to concentrate light by dividing the lens into a set of concentric annular segments or rings, called Fresnel zones.

FIG. 1A illustrates a high-concentrating photovoltaic (HCPV) system with aspects of the present disclosure (hereinafter interchangeably referred to as "system 100"). As shown in FIG. 1A, the system 100 includes a plurality of modules 102, a casing 106, a plurality of solar cells 108 (also referred to as photovoltaic solar cells 108), and a backplate 110.

The plurality of modules 102 is connected along the casing 106 to form an array. In some embodiments, the array may be rectangular, triangular, circular, cylindrical, or polygonal. Each of the plurality of modules 102 uses solar concentrators such as lenses, mirrors, or optical components to concentrate large amounts of solar radiation onto a small area of photovoltaic solar cell 108 to generate electricity. In some embodiments, the modules 102 have a length from 1 mm to 30 mm, preferably 3 mm to 27 mm, preferably 5 mm to 25 mm, preferably 7 mm to 22 mm, preferably 9 mm to 19 mm, preferably 11 mm to 17 mm, preferably 13 mm to 15 mm, or 14 mm.

The plurality of solar cells 108 is configured to convert solar energy into electricity. The plurality of solar cells 108 is distributed uniformly on the backplate 110 in an array. In some embodiments, the array may be rectangular, triangular, circular, cylindrical, or polygonal. The solar cells 108 can be monocrystalline, polycrystalline, amorphous, or a combination thereof. The backplate 110 is configured to protect the inner components of the modules, specifically the plurality of solar cells 108 and electrical components such as wires, from external stresses. In some embodiments, the backplate array may be divided into backplate sections corresponding to the modules 102, each backplate module having a width from 0.01 m to 0.5 m, preferably 0.05 m to 0.45 m, preferably 0.1 m to 0.4 m, preferably 0.15 m to 0.35 m, preferably 0.2 m to 0.3 m, or 0.25 m. In some embodiments, the backplate 110 may include electric insulation layers, sealing layers, heat insulation layers, or waterproof layers.

The casing 106 is configured to enclose all the components of the system 100. The casing 106 has a top frame 114 and a bottom frame 116. The top frame 114 surrounds the plurality of modules 102 at a periphery of the array. In one aspect, the top frame 114 has a transparent window through which solar radiation can easily pass. The bottom frame 116 surrounds a periphery of the backplate 110. The top frame 114 and the bottom frame 116 are separated by a plurality of supports (side walls).

Figure 1B:
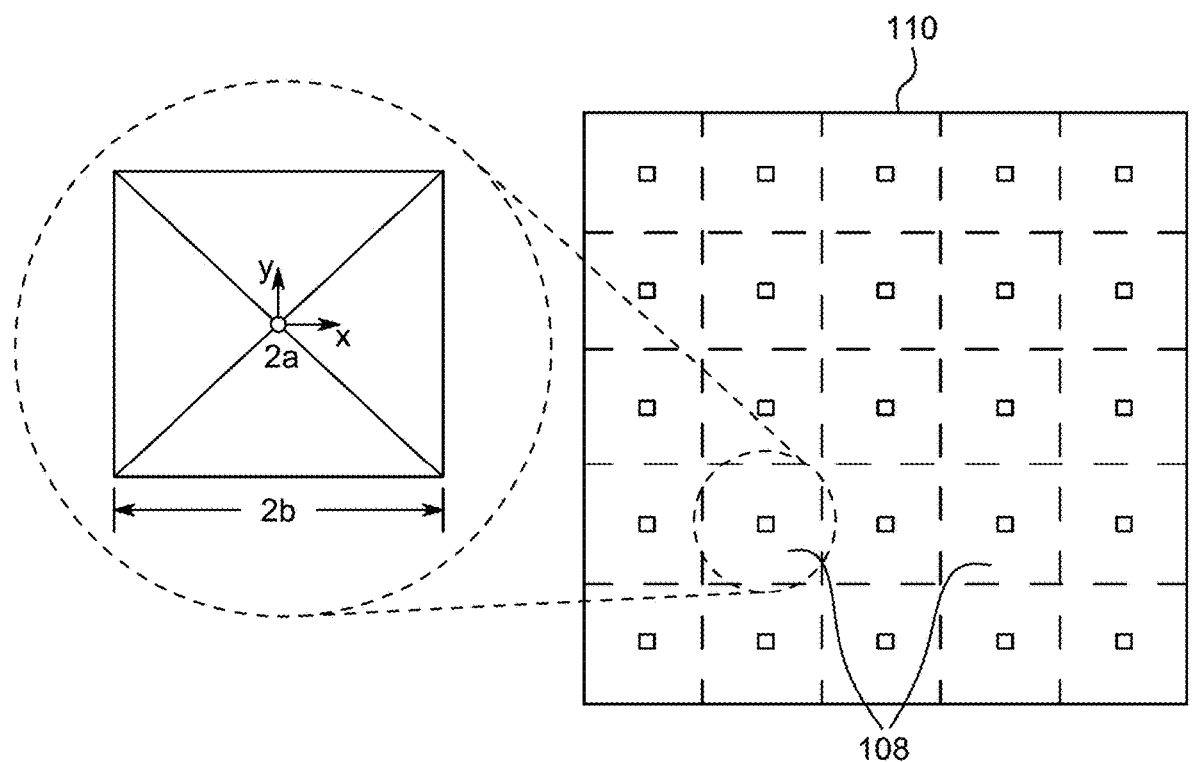
FIG. 1B illustrates a top view of a solar cell and a backplate in a HCPV system.

FIG. 1B illustrates a top view of the solar cell 108 and the backplate 110 placed in the HCPV system 100. As shown in FIG. 1B, the solar cells 108 are distributed uniformly on the backplate 110. In an example, the backplate 110 is an aluminum sheet. In certain embodiments, the backplate may be boron, gallium, indium, or thallium. The solar cell 108 is attached to the backplate 110 via an adhesive material, such as epoxies, polyurethanes, polyimides, polyamides, polyesters, acetates, rubbers, or propylene copolymers. Each of the solar cells is connected by at least one interconnected line. In an aspect, the interconnected line acts as an adiabatic boundary due to distribution symmetry, as shown in FIG. 1B.

In the system 100, the backplate area is equal to the total areas of the optical components such as Fresnel lenses, as shown in FIG. 1A. Therefore, to study the sufficiency/redundancy of the area of the backplate 110, each module 102 in the system 100 is considered to have its own heat spreader (instead of having one plate for all solar cells) in which the size of the heat spreader (b) varies between the size of the solar cell 108 and the size of the optical components ($a<b\leq b_{fl}$).

Figure 1C:
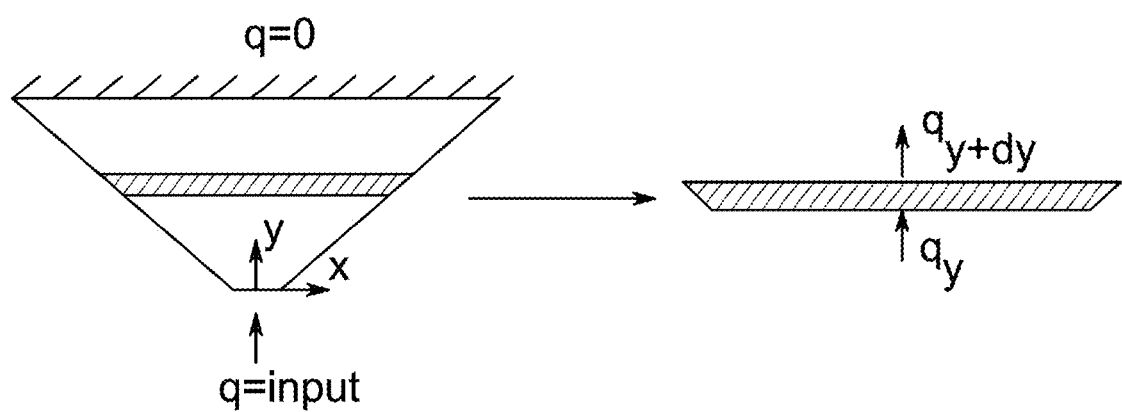
FIG. 1C illustrates a heat transfer direction and boundary conditions for a HCPV system.

FIG. 1C illustrates a heat transfer direction and boundary conditions of the in the system 100. The surface area of a backplate section, which is around one solar cell 108, may be divided into four identical parts. These identical parts are the imaginary four triangles formed by the two diagonals of a square-shaped backplate section. The parts, in certain embodiments, may be square, rectangular, or polygonal. Due to the symmetry of the four formed triangles, the thermal problem associated with the solar cell 108 may be presented in a trapezoidal form, as shown in FIG. 1C (assuming the temperature of the solar cell area is uniform). Hence, the heat transfer equation of the thermal problem, taking the surface radiation and convection heat transfer from the two sides of the backplate section into consideration, may be written in the following form:

$$\frac{d^2T}{dy^2} + \frac{1}{(y+a)}\frac{dT}{dy} - \frac{2b}{kt}(T - T_\infty) = 0 \quad (1)$$

under the following two boundary conditions:

$$\frac{dT}{dy}\bigg|_{y=0} = \frac{-a^2 \times CR \times I \times \eta_{opt}(1 - \eta_{STC})}{2a \times k \times t} \quad (2)$$

$$\frac{dT}{dy}\bigg|_{y=b_{fl}-a} = 0 \quad (3)$$

in which:
 a=half of the solar cell size;
 $b_{fl}$=half of the Fresnel lens size;
 t=backplate section thickness (m);
 k=backplate section thermal conductivity (Wm$^{-1}$ K$^{-1}$);
 I=direct normal irradiance (Wm$^{-2}$);
 CR=concentration ratio;
 T=temperature of the backplate section;
 $T_\infty$=ambient temperature;
 y=length of the backplate section;
 b=Fresnel lens size;
 $\eta_{opt}$=optical efficiency of the Fresnel lens;
 $\eta_{STC}$=electrical efficiency at standard test conditions (STC) as provided by the manufacturer;
 h=the combined radiative/conductive heat transfer coefficient of air around the aluminum backplate section; and
 h may be obtained by the following equation:

$$h = \left(0.848 k_a \left(\frac{\cos(w)vPr}{v}\right)^{0.5}\right) / \left((bn)^{0.5} + 4\sigma\varepsilon T_\infty^3\right) \quad (4)$$

in which:
 ε=emissivity of aluminum backplate section;
 σ=Stefan-Boltzmann constant=5.67×10$^{-8}$ Wm$^{-2}$ K$^{-4}$ for air;
 $k_a$=thermal conductivity of air=0.026 Wm$^{-1}$ K$^{-1}$;
 w=wind direction (degrees);
 v=wind speed (m s$^{-1}$);
 Pr=Prantdl number of air;
 v=kinematic viscosity of air (m$^2$ s$^{-1}$); and
 n=number of modules in each row.

The analytical model of equation (1) associated with its boundary conditions (equations (2) and (3)) can be written as shown by equation (5).

Where:

$$\gamma = i\frac{\sqrt{2h}}{\sqrt{k \times t_c}}$$

$Y_1$ and $Y_0$ are the Bessel function of the second kind;
 $\vartheta$=regularized confluent hypergeometric function;
 C=specific heat capacity;
 i=imaginary part equal to $\sqrt{-1}$ The conversion efficiency of PV solar cell 108 decreases with an increase in temperature. The electrical efficiency of the solar cell 108 may be represent as a function of the solar cell temperature and its electrical efficiency at the reference condition is given by the equation shown below:

$$\eta = \eta_{STC} \times 100 \times [1 - \beta(T_s - T_{ref}) + \gamma\log_{10}(I)] \quad (6)$$

in which:
 η=solar cell efficiency;
 β=the temperature coefficient of the solar cell;
 Ts=solar cell temperature;
 $T_{ref}$=reference cell temperature (25° C.);
 γ=solar radiation coefficient (ga); and
 I=direct normal irradiance.

The maximum power to be produced from the system 100 may be calculated from the following Equation:

$$P_{max} = 4\eta I a^2 CRm\eta_{opt}/100 \quad (7)$$

in which:
 $P_{max}$=maximum produced power (W);
 m=number of solar cells in the system.

The wind and weight loads may be calculated from the following Equation:

$$J_{tot} = J_{load-weight} + J_{load-wind} \quad (8)$$

in which:
 $J_{tot}$=the total inertial load.

$$T(y) = \frac{\left[i\left[-i\sqrt{2}\,Y_1(-b\gamma)\left(C(-1+\eta_{STC})\eta_{opt}I\vartheta\left[1, \frac{h(a+y)^2}{2kt}\right] + 2hT_\infty\vartheta\left[2, \frac{a^2h}{2kt}\right]\right) + \right.\right.}{\left(2\sqrt{2}\left(ahY_1(-b\gamma)\vartheta\left[2, \frac{a^2h}{2kt}\right] - bhY_1(-a\gamma)\vartheta\left[2, \frac{b^2h}{2kt}\right]\right)\right)} \quad (5)$$

By substituting the relevant expressions into equation (8), equation (9) may be formed:

$$J_{tot} = \frac{1}{12}m(4 \times n^2 b^2) + \frac{1}{2}C_m \times \rho_{air} \times v^2 \times (4 \times n^2 \times b^2) \times (2 \times n \times b) \qquad (9)$$

Thus, the total torque load (Tq) can be obtained from the following equation:

$$Tq = J_{tot} \times a_{ang} \qquad (10)$$

Hence, the consumed power can be calculated as depicted by equation (11):

$$P_{cons} = Tq \times \omega_{ang} \qquad (11)$$

Substituting equations (9) and (10) into equation (11) yields equation (12):

$$P_{cons} = \omega_{ang} \times a_{ang} \times \left(\frac{1}{12}t \times \rho(2nb)^4 + \frac{1}{2}C_m \times \rho_{air} \times v^2 \times (2 \times n \times b)^3\right) \qquad (12)$$

in which:
$\omega_{ang}$=angular velocity of the shaft;
$a_{ang}$=angular acceleration of the system;
$\rho$=density of aluminum (kg m$^{-3}$); and
$C_m$=moment coefficient.

Accordingly, the net produced power equals maximum attainable power–consumed power by a tracking system as revealed in equation (13):

$$P_{net} = P_{max} - P_{cons} \qquad (13)$$

Solar tracking systems aim to maximize collected radiation by allowing a collector to follow the Sun's path and keep the Sun's rays normal to the solar collector surface at all times. This type of tracking system enhances the performance of the collector. Consequently, the power consumed by the attached tracking system may be estimated by evaluating the total load inertia of the system.

Figure 2A:
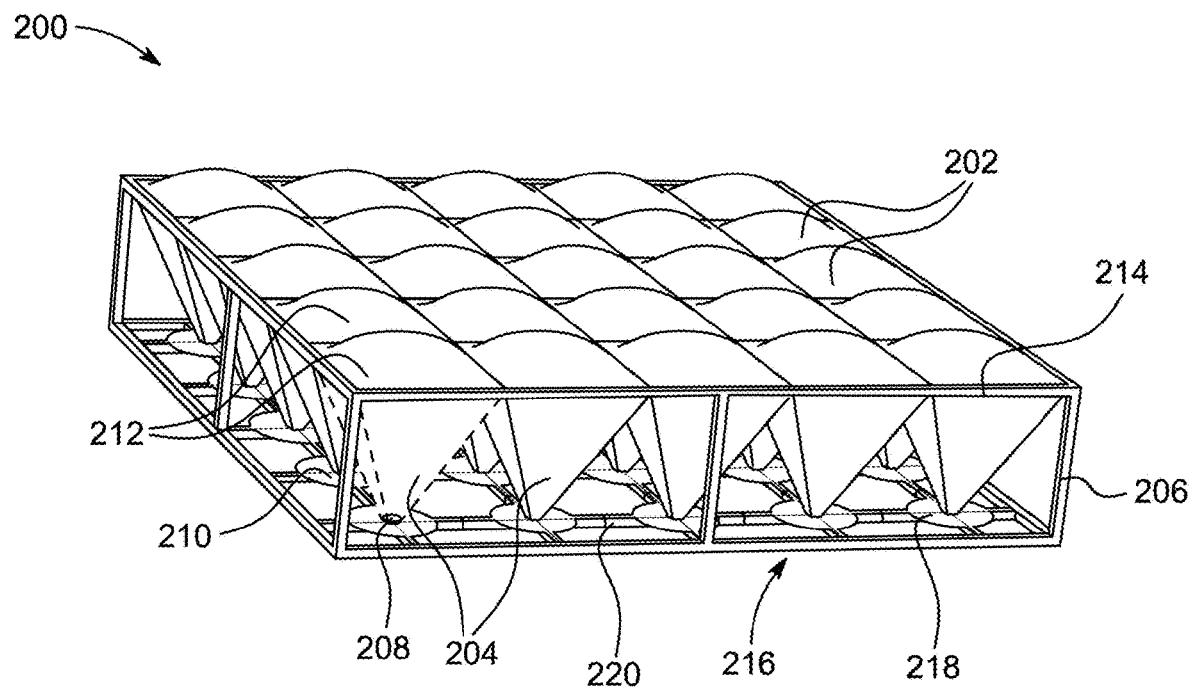
FIG. 2A illustrates a high-concentrating photovoltaic (HCPV) system, according to aspects of the present disclosure.

FIG. 2A illustrates a high-concentrating photovoltaic (HCPV) system (hereinafter interchangeably referred to as "HCPV system 200"), according to one or more aspects of the present disclosure. As shown in FIG. 2A, the HCPV system 200 includes a plurality of modules 202, a plurality of inverted pyramids 204, a casing 206, a plurality of solar cells 208, and a backplate array 210.

The plurality of modules 202 is connected to form an array. In some embodiments, the array is rectangular, spherical, triangular, cylindrical, or polygonal. Each of the plurality of modules 202 includes an inverted pyramid 204. The plurality of modules 202 is configured to use an optical component 212 that is configured to concentrate light onto a single solar cell 208. In an example, the optical component 212 is a lenticular lens, a Fresnel lens, or a metalens. In an aspect, the optical component 212 is configured to focus, amplify, absorb, scatter, shoot, diffract, reflect, refract, or redirect the light, travelling from a light source towards the solar cell 208. For an example, the HCPV system 200 uses the Fresnel lens to focus the sunlight onto a small area of the solar cell 208. In an aspect, the optical component 212 may be reflective, refractive, or a hybrid. In an example, each Fresnel lens has a length and a width of at least 200 mm, preferably 220 mm, preferably 240 mm, preferably 260 mm, preferably 280 mm, preferably 300 mm, preferably 320 mm, preferably 340 mm, preferably 360 mm, preferably 380 mm, or 400 mm. Due to the limited absorption capability for the light spectrum, the solar cell 208 may not be able to convert 100% of the focused light energy into electrical energy for output. Therefore, a significant portion of the focused light energy causes heat accumulation in the module 202, causing the temperature of the module 202 to rise, increasing internal dark current and decreasing the conversion efficiency of the solar cell 208. To overcome such issues, the Fresnel lens 212 has a thermal coating layer. In an aspect, the thermal coating layer includes thermoplastic elastomers, such as styrenic block copolymers, thermoplastic polyolefinelastomers, thermoplastic vulcanizates, thermoplastic polyurethanes, thermoplastic copolyesters, thermoplastic polyamides, or a combination of the like. In an aspect, the thermal coating layer is formed to increase the thermal emissivity of the Fresnel lens 212. In an example, the emissivity of the thermal coating layer is of from 0.9 to 0.97, preferably 0.905 to 0.965, preferably 0.91 to 0.96, preferably 0.915 to 0.955, preferably 0.92 to 0.95, preferably 0.925 to 0.945, preferably 0.93 to 0.94, or 0.935. In another example, the emissivity of the thermal coating layer is of from 0.5 to 0.6, preferably 0.51 to 0.59, preferably 0.52 to 0.58, preferably 0.53 to 0.57, preferably 0.54 to 0.56, or 0.55.

The plurality of solar cells 208 converts solar energy into electricity. Each of the plurality of solar cells 208 is adiabatically separated from one another. For example, a number of the plurality of solar cells 208 is at least twenty-five (25), preferably at least 28, preferably at least 30, preferably at least 33, preferably at least 35, preferably 38, preferably at least 40, preferably at least 43, preferably at least 45, preferably at least 48, or 50. In some examples, there are at least five (5) solar cells in a row on the backplate array 210, preferably at least 6, preferably at least 7, preferably at least 8, preferably at least 9, or 10. In an example, each solar cell 208 is a triple-junction solar cell. In some embodiments, each solar cell 208 is a single-junction solar cell, preferably double-junction, preferably four-junctions, or five-junctions. For example, the triple-junction solar cell 208 has a length and a width of from 5 mm to 10 mm, preferably 5.5 mm to 9.5 mm, preferably 6 mm to 9 mm, preferably 6.5 mm to 8.5 mm, preferably 7 mm to 8 mm, or 7.5 mm. In some examples, the triple-junction solar cell 208 has a length and a width of from 1 mm to 5 mm, preferably 1.5 mm to 4.5 mm, preferably 2 mm to 4 mm, preferably 2.5 mm to 3.5 mm, or 3 mm.

Figure 2B:
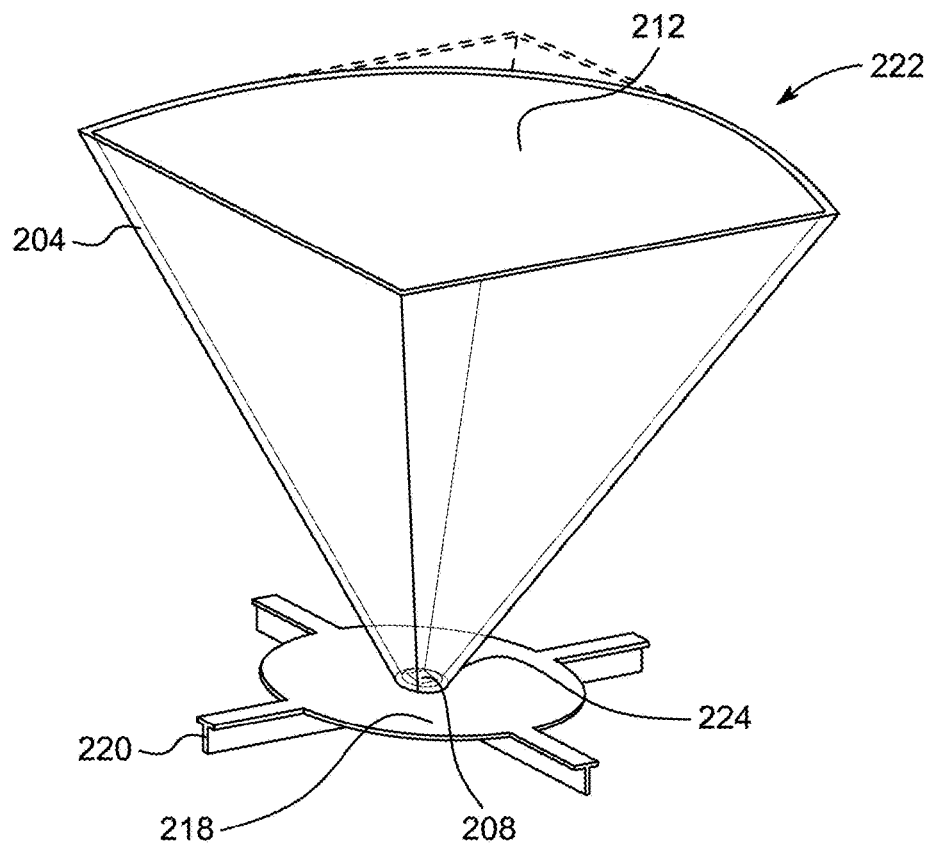
FIG. 2B illustrates an enlarged view of an inverted pyramid, according to aspects of the present disclosure.

In a structural aspect, the inverted pyramid 204 includes solid lateral faces and a base. The inverted pyramid can be thought of as a truncated pyramid, as depicted in FIG. 2B, where the apex is chopped off. The solid lateral faces form an apex of the inverted pyramid 204, where the apex is chopped off about 5% of the total height of the pyramid, preferably from 1 to 7% of the height of the pyramid, 2-6%, or 3-4% of the height of the pyramid, and is therefore a truncated apex. Each of the plurality of inverted pyramids 204 is configured to hold at least one optical component 212 at a peripheral edge of the base of the pyramid 204. Further, the single inverted pyramid 204 has the solar cell 208 at the apex of the inverted pyramid 204. In an example, a number of the plurality of inverted pyramids is twenty-five (25). Non-limiting examples of the inverted pyramid 204 include triangular prisms, square prism, rectangular prisms, polygonal prisms, or cones.

The casing 206 is configured to surround all the components of the HCPV system 200. The casing 206 has a top frame 214 and a bottom frame 216. The top frame 214 surrounds a periphery of the array. In one aspect, the top frame 214 has a transparent window through which solar radiation can easily pass. The bottom frame 216 surrounds a periphery of the array. The top frame 214 and the bottom frame 216 are separated by a plurality of supports (e.g., side walls or columns). Non-limiting examples for materials used for the top frame 214 and bottom frame 216 include glass, plexiglass, aluminum, gallium, platinum, plastic, or rubber. In some embodiments, there may be at least 10 side walls or columns between the top frame 214 and the bottom frame 216, preferably at least 12, preferably at least 14, preferably at least 16, preferably at least 18, or 20. For example, but not by way of limitation, the casing 206 of the present disclosure may be square, rectangular, hexagonal, or any other polygonal shape, or any combination of such shapes, or any elliptical shape. The casing 206 is made of material that is rust-free, non-rusting, corrosion-resistant, and/or acid-resistant, such as glass or rubber. The casing 206 may be made of plastic, an insulating material, or metal. The casing 206 is made of a lightweight material such as aluminum or resin. Consequently, the HCPV system 200 is lightweight with the casing and enclosed components having a weight of at most 10 kg, preferably at most 9 kg, preferably at most 8 kg, preferably at most 7 kg, preferably at most 6 kg, preferably at most 5 kg, preferably at most 4 kg, preferably at most 3 kg, or 2 kg. The lightweight nature of the casing promotes easier transportation of the system 200.

In an example, the casing 206 is configured to surround the HCPV system 200. The casing 206 may also include a front side and a back side. In one aspect, the casing 206 is configured to enclose the system 200 in an airtight manner, thereby protecting the contents from various environmental factors such as humidity, pressure, wind, and so on. In another aspect, the casing 206 is configured enclose the system partially in a manner that allows airflow into system 200 to prevent overheating.

The backplate array 210 is configured to protect the inner components of the module 202, specifically the solar cells 208 and electrical components such as wires, from external stresses. For example, the backplate array 210 includes a plurality of interconnected pads 218 connected by a grid structure 220. One such interconnected pad 218 can also be referred to as a "backplate pad" or a "heat spreader". In an example, the structure of backplate pads 218 may be circular, cylindrical, triangular, square, or rectangular. In an example, the backplate pads 218 may be glass, plastic, rubber, silicones, nitriles, vinyl, or polyurethanes. Preferably all of the backplate pads are coplanar and connected by a coplanar support.

FIG. 2B illustrates an enlarged view of the inverted pyramid 204. As shown in FIG. 2B, the inverted pyramid 204 has a base 222 and an apex 224. The inverted pyramid 204 is configured to hold the optical component 212 on the base 222. Further, the apex 224 is coupled to the solar cell 208. The circular pads 218 is configured to surround the solar cell 208. The circular pad 218 includes the solar cell 208 in the center. Thereby, in the present HCPV system 200, the backplate pad area is not equal to the total areas of the Fresnel lenses 212. In an example, the backplate pad area is 1.1 times greater than the total area of the Fresnel lenses 212, preferably 1.2 times greater, preferably 1.4 times greater, preferably 1.6 times greater, preferably 1.8 times greater, or 2 times greater. In an example, the total area of the Fresnel lenses is 1.1 times greater than the backplate pad area, preferably 1.2 times greater, preferably 1.4 times greater, preferably 1.6 times greater, preferably 1.8 times greater, or 2 times greater. The grid structure 220 is configured to interconnect at least two circular backplate pads 218. In some embodiments, the grid structure 220 connects the two circular backplate pads in a square configuration, rectangular configuration, circular configuration, hexagonal configuration, or polygonal configuration. In some embodiments, the grid structure is made of materials such as glass, plastics, rubbers, elastomers, resins, plexiglass, metals, or a combination of the like.

Figure 3A:
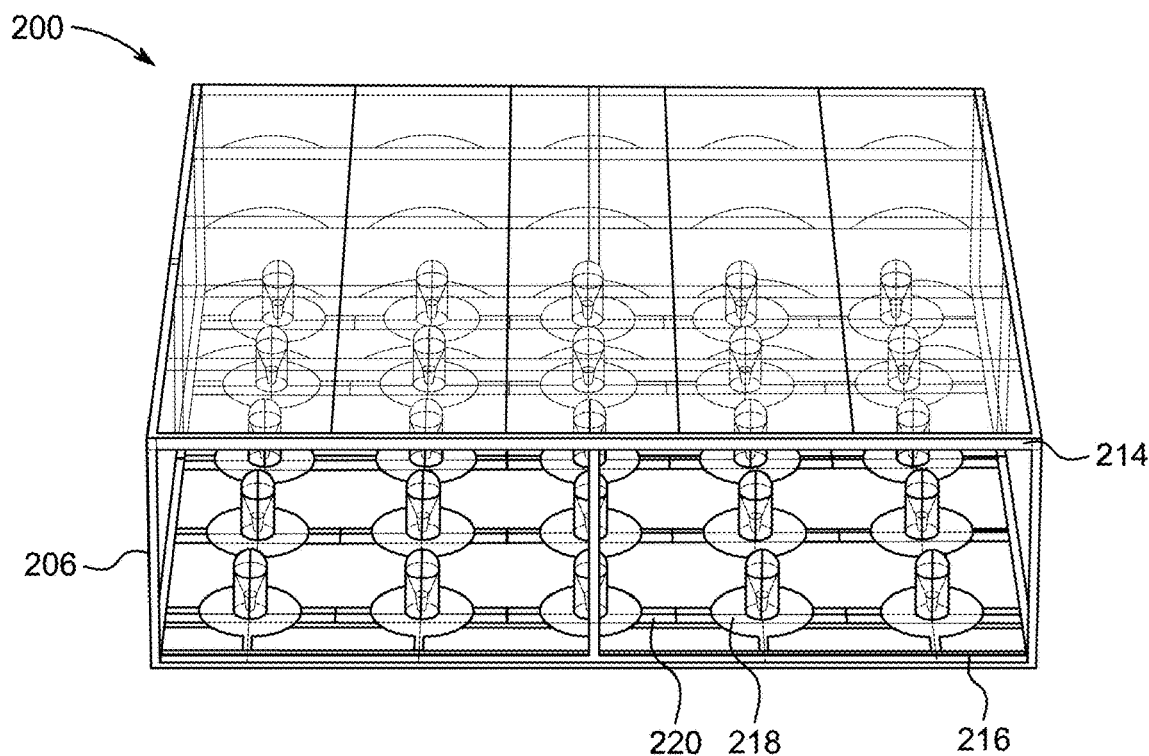
FIG. 3A depicts an interconnection view of a plurality of interconnected circular pads, according to aspects of the present disclosure.

FIG. 3A illustrates an interconnection view of a plurality of interconnected circular backplate pads 218. FIGS. 2B and 3A depict each of the plurality of interconnected circular backplate pads 218 includes the solar cell 208 arranged in the center portion of each of the circular backplate pad 218. Further, the grid structure 220 connects the plurality of circular backplate pads 218 to the bottom frame 216. In an example, the backplate array 210 is in a shape of a square. In another example, the backplate array 210 may be of any shape including circular, rectangle, hexagonal and such shapes. In an example, a length of a backplate pad 218 is from 0.02 m to 0.06 m, preferably 0.025 m to 0.055 m, preferably 0.03 m, preferably 0.05 m, preferably 0.035 m to 0.045 m, or 0.04 m. In an example, the plurality of circular backplate pads 218 is at least twenty-five (25), preferably at least 30, preferably at least 35, preferably at least 40, preferably at least 45, or 50. In an example, thickness of the circular backplate pad 218 is in a range of from 1 mm to 5 mm, preferably 1.5 mm to 4.5 mm, preferably 2 mm to 4 mm, preferably 2.5 mm to 3.5 mm, or 3 mm. In another example, the thickness of each circular backplate pad 218 is of from 5 mm to 10 mm, preferably 5.5 mm to 9.5 mm, preferably 6 mm to 9 mm, preferably 6.5 mm to 8.5 mm, preferably 7 mm to 8 mm, or 7.5 mm. In an example, the backplate pad has a thermal conductivity of from 200 W/mK to 400 W/mK, preferably 225 W/mK to 375 W/mK, preferably 250 W/mK to 350 W/mK, preferably 275 W/mK to 325 W/mK, or 300 W/mK. In an example, the Fresnel lens has an optical efficiency of from 0.8 to 0.9, preferably 0.81 to 0.89, preferably 0.82 to 0.88, preferably 0.83 to 0.87, preferably 0.84 to 0.86, or 0.85.

In an example, a ratio of the length of the backplate pad 218 to half a length of a Fresnel lens is of from 0.6 to 0.7, preferably 0.61 to 0.69, preferably 0.62 to 0.68, preferably 0.63 to 0.67, preferably 0.64 to 0.66, or 0.65. In another example, the ratio of the length of the backplate pad 218 to half a length of a Fresnel lens 212 is of from 0.7 to 0.8, preferably 0.71 to 0.79, preferably 0.72 to 0.78, preferably 0.73 to 0.77, preferably 0.74 to 0.76, or 0.75.

Figure 3B:
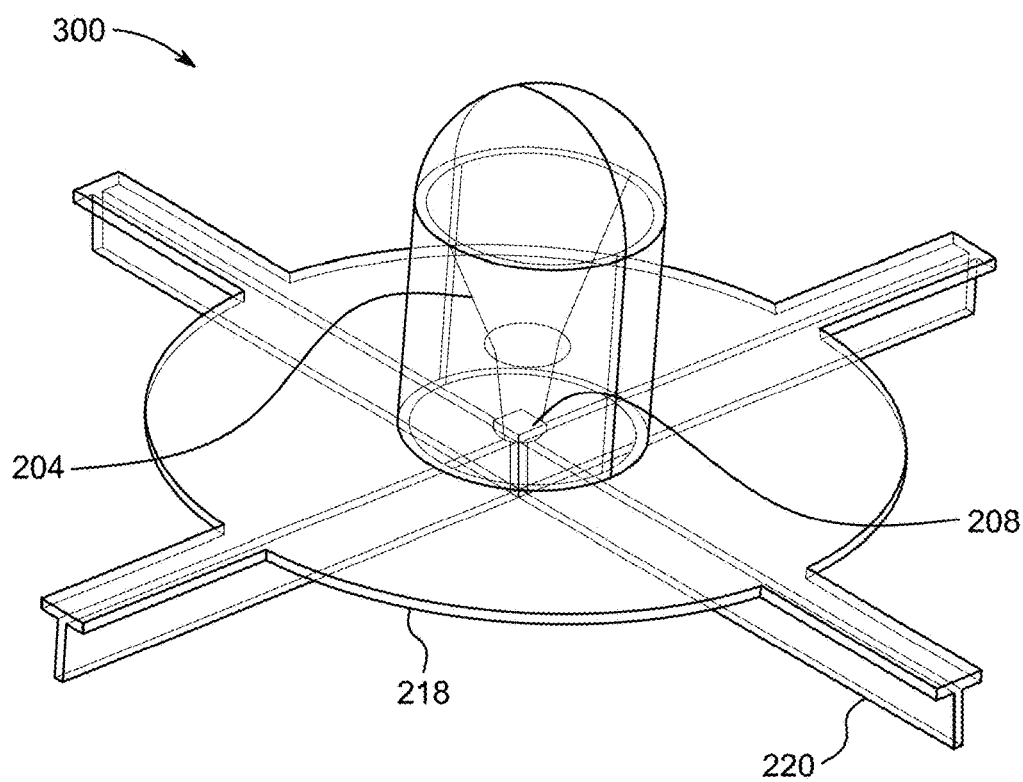
FIG. 3B depicts an enlarged view of a HCPV module, according to aspects of the present disclosure.

FIG. 3B depicts an enlarged view of an HVAC module 300. The HVAC module 300 has the circular backplate pad 218 and the grid structure 220. FIGS. 2B, 3A, and 3B depict the HVAC module 300 also includes the optical component 212 and the single inverted pyramid 204. Also depicted, the inverted pyramid 204 has the optical component at the peripheral edge of the base 222. The circular backplate pad 218 includes the solar cell 208 in the center. The grid structure 220 is configured to connect at least two circular backplate pads 218. In an example, the grid structure 220 is a railing structure. As shown in FIG. 3B, the HVAC module 300 has four (4) grid structures directed outwards. Therefore, each HVAC module 300 is connected with four (4) other HVAC modules 300, thereby creating an interconnected mesh of HVAC modules 300. In an aspect, the module 300 has 5 grid structures, preferably 6 structures, preferably 7, preferably 8, preferably 9, or 10. In an aspect, the circular backplate pad 218 is connected to the grid structure 220 via an adhesive or a press-fit mechanism. In an aspect, the adhesive can be polyamides, polyesters, ethylene-vinyl acetate, polyurethanes, or a variety of block copolymers and elastomers such as butyl rubber, ethylene-propylene copolymer, and styrene-butadiene rubber. In an aspect, the HVAC module 300 has a housing configured to enclose the optical component 212 and the single inverted pyramid 204.

Figure 4:
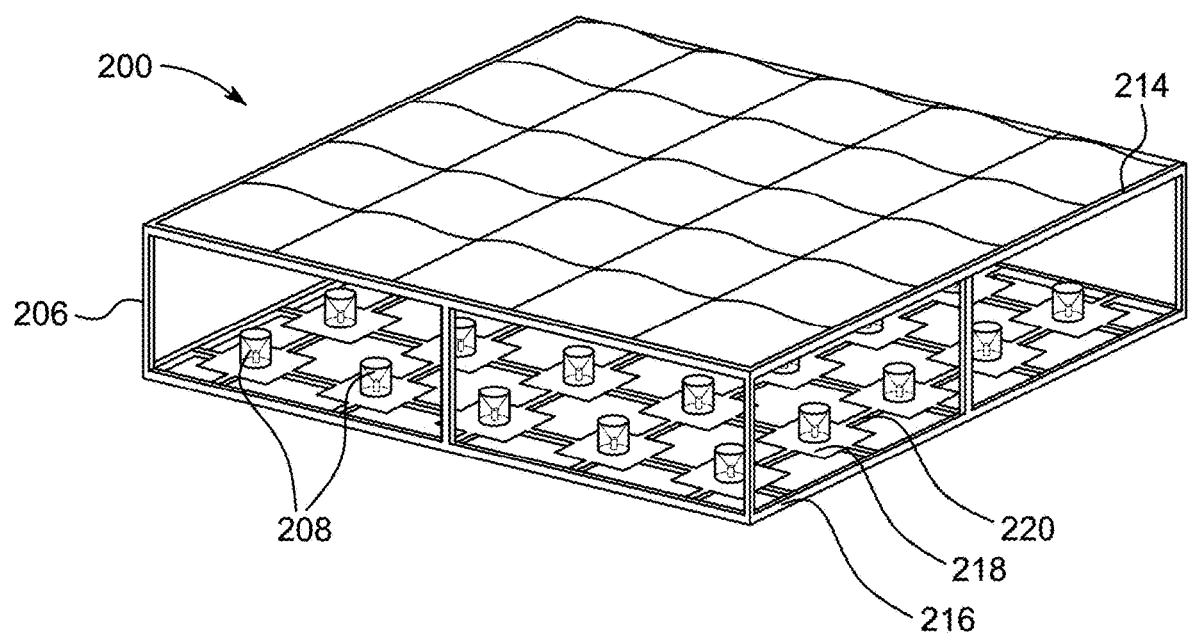
FIG. 4 represents a cross-sectional view of the HCPV system, according to aspects of the present disclosure.

FIG. 4 represents a cross sectional view of the HCPV system 200, according to aspects of the present disclosure. As shown in FIGS. 2B and 4, in an example, the backplate array 210 is a plurality of interconnected square backplate pads 218. Each of the plurality of interconnected square backplate pads 218 includes the solar cell 208. The plurality of interconnected square backplate pads 218 are interconnected by the grid structure 220. Further, the plurality of interconnected square backplate pads 218 is connected to the bottom frame 216 using the grid structure 220.

EXAMPLES

The following examples are provided to illustrate further and to facilitate the understanding of the present disclosure.

Experimental Data and Analysis

Equations (1-13) were checked for validation by comparing the analytical results with the outdoor experimental data present in the art. The aim of experimentation, in addition to validating the accuracy of the presented analytical equations (1-13), is also find out that the present disclosure may be used to investigate the net power produced by the HCPV system 200 after deducting the power consumed by the HCPV system 200 for tracking operation. The present system 200 has been validated using a HCPV module under operation in real-world environmental conditions.

First Experiment

Validation of Produced Power Results

Figure 5:
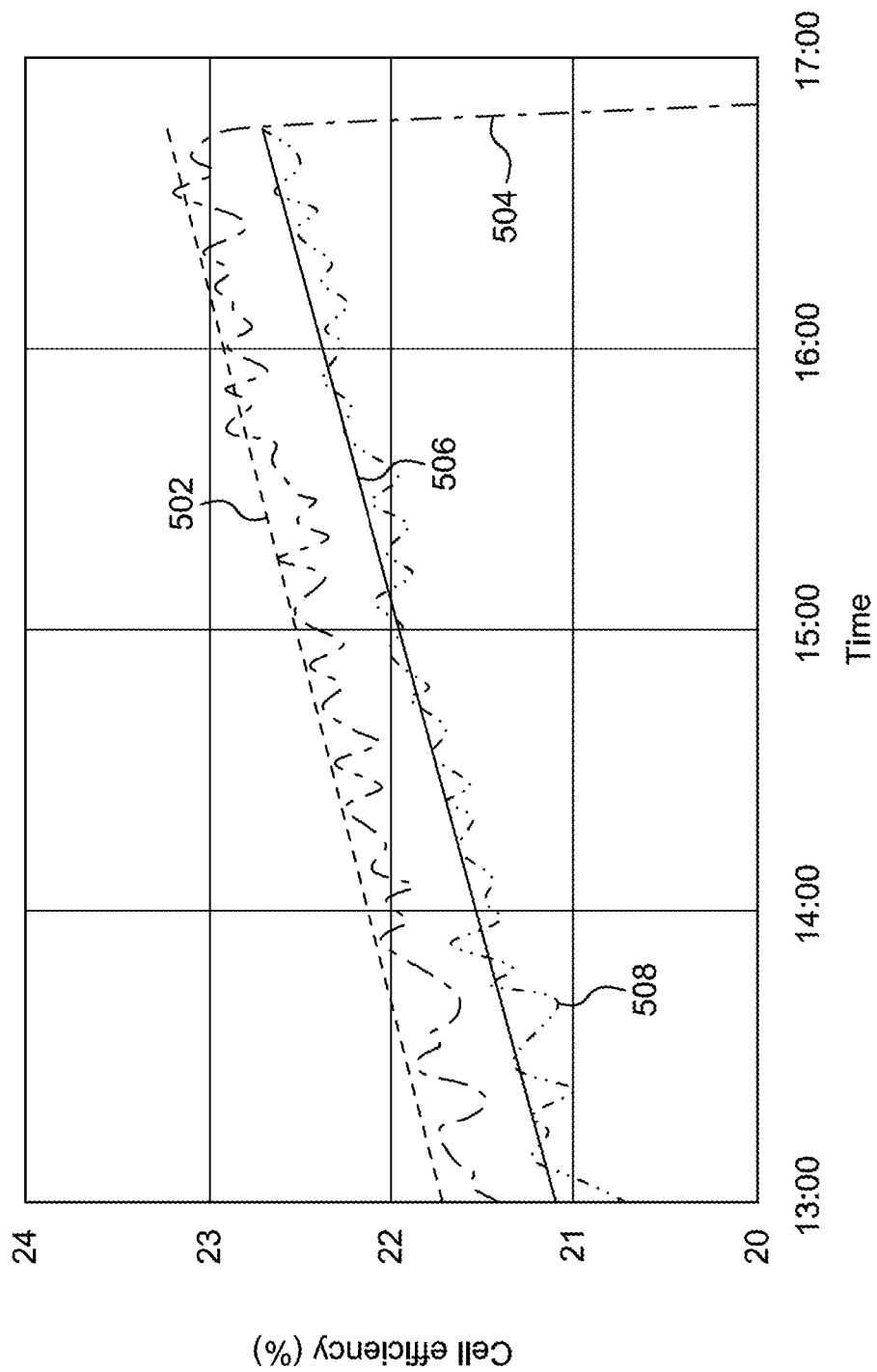
FIG. 5 illustrates a variation of electric conversion efficiency with time, according to aspects of the present disclosure.

FIG. 5 illustrates a variation of electric conversion efficiency with time. The efficiency of a 820× CPV system was tested during outdoor operation and recorded from the literature. Signal 504 shows the cell efficiency already present in the system 100 with thermal radiation coating. Signal 508 shows the cell efficiency of the system 100 without thermal radiation coating. The tested system 100 included 25 modules. Each module had a 7 mm×7 mm triple-junction solar cell and a 200 mm×200 mm Fresnel lens. The emissivity of the thermal coating layer was 0.95, and that of aluminum without coating was 0.1. Using the same real values of ambient temperature, wind speed, and direct normal irradiance presented in the available literature, results of the HCPV system of the present disclosure is shown in FIG. 5. Signal 506 shows the cell efficiency of the present HCPV system 200 without thermal radiation coating. Signal 502 shows the cell efficiency of the present HCPV system 200 with thermal radiation coating. The correlation between the two findings is very strong, with a maximum deviation of 1.8%.

Figure 6:
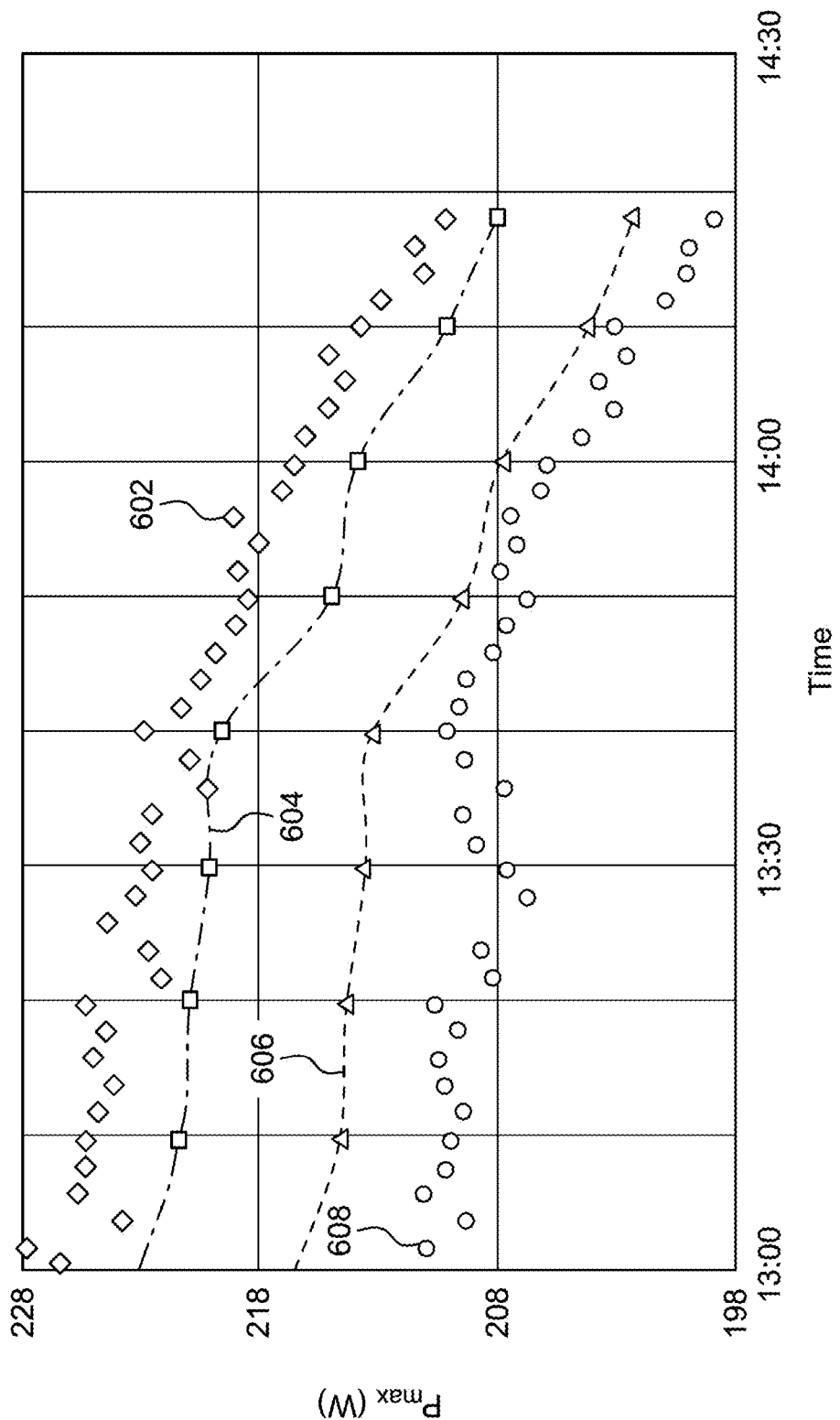
FIG. 6 illustrates a maximum produced power of a concentrating photovoltaic (CPV) module for two different backplate pad thicknesses, according to aspects of the present disclosure.

FIG. 6 illustrates a maximum produced power of a concentrating photovoltaic (CPV) module for two different backplate pad thicknesses. FIG. 6 compares the two results for the maximum produced power as a function of time under variable weather conditions and incident illumination. Signal 602 shows the power of the CPV module having backplate pad thickness=4 mm. Signal 608 shows the power of the CPV module having backplate pad thickness=2 mm. The real weather conditions and the direct normal irradiance used to produce the results may be found in an already performed literature work. Signal 604 shows the power of the HCPV module 300 (present module) having backplate pad thickness=4 mm. Signal 606 shows the power of the HCPV module 300 of the present disclosure having backplate pad thickness=2 mm. The comparison revealed a good agreement between the two results with a maximum deviation of 2.9%.

Second Experiment

Validation of Consumed Power Results

In the system 100, the solar tracking frequency, and the power generation of the 4.5 kW HCPV system was correlated. The system included 2 modules; each module contains 24 triple-junction solar cells with 39% conversion efficiency. Using the Fresnel lens, the solar cells were operated under 500 suns. The analysis of the measurements showed that the daily energy consumption of a solar tracker was 41.3 Wh (3.59 W). To validate the accuracy of the solar tracking consumption obtained by the present HCPV system 200, the power consumed by the solar tracker of the 4.5 KW HCPV system was calculated using equation (12) at the same input parameters and metrological data as done in the present work.

The average wind speed in Kunming during the autumn season is 1.94 m/s, and the present results showed that the power consumed by the solar tracker was 3.608 W, which represents a 0.5% deviation from the experimental data.

Furthermore, the available results of power consumed by the solar tracker were also compared with the one-year experimental results from the practical field operation of the 9 kW HCPV system constructed in Kunming, China. This system consisted of 96 modules, and each had 24 solar cells. The size of the III-V solar cell is 5.5 mm×5.5 mm, and it operates under 500 suns. The experiment results showed that the tracking system consumed 43 kWh per year (10.43 W), while the results showed that the consumed power at $u_{avg}$=2.0625 m/s was 11.2 W, which represents a 7.28% deviation from the experimental result.

Figure 7:
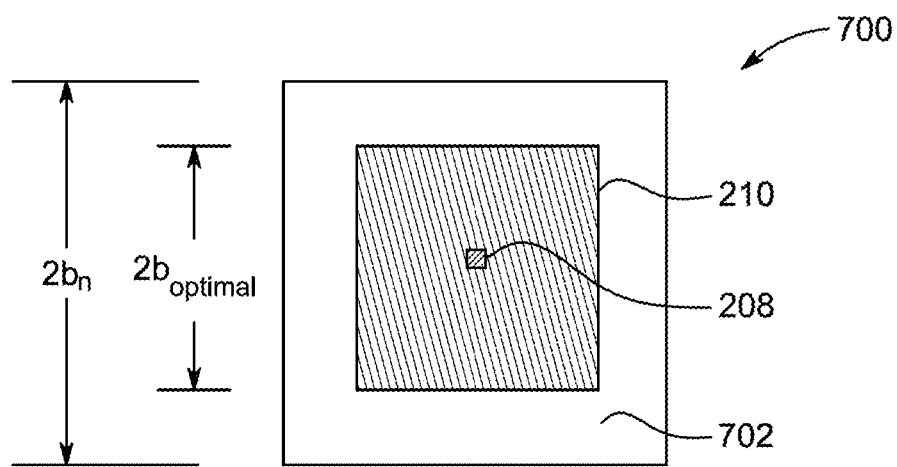
FIG. 7 represents a top view of a heat spreader of a photovoltaic module, according to aspects of the present disclosure.

FIG. 7 represents a top view of a heat spreader 600 of a photovoltaic (HCPV) module 300, according to aspects of the present disclosure. The heat spreader 700 includes the solar cell 208 in the center of the heat spreader 700. Further the solar cell 208 is surrounded with a heat spreader plate acting as the backplate pad 218. The redundant area 702 is defined as a part of the heat spreader 700 that remains uncovered by the heat spreader plate 210. The present HCPV system 200 was also implemented for the determination of solar cell system performance. In an example, a similar HCPV system 100 as the one shown in FIG. 1A was considered with the following components: 25 solar cells with five cells per row. The ambient temperature ranged from 20° C. to 50° C. Backplate pad thermal conductivity, optical efficiency, electrical efficiency at STC, wind direction, and temperature and solar radiation coefficients were kept constant at the values of 205 W/m K, 0.85, 0.26, 45°, −0.00106/K, and 0, respectively. Two cases having different solar cell size were analyzed, namely a 10 mm×10 mm solar cell, and a 3×3 mm solar cell, which represents the majority of the available commercial options on the global market. The effects of five input parameters on solar cell efficiency, maximum produced power, power consumption of tracking power, and net power were investigated and are presented in the present HCPV system 200. These five parameters included ambient temperature, the emissivity of the backplate pad 218, wind speed, backplate pad thickness, and backplate pad length. In the HCPV system 100, the backplate pad area was equal to the total areas of the Fresnel lenses. To study the sufficiency/redundancy of the area of the backplate pad, each module in the system 100 was considered to have its heat spreader (instead of having one plate for all solar cells) in which its size varied between the size of the solar cell and the size of the Fresnel lens ($a<b \leq b_{fl}$) as shown in FIG. 7.

Third Experiment

Solar Cell Efficiency

Figure 8A:
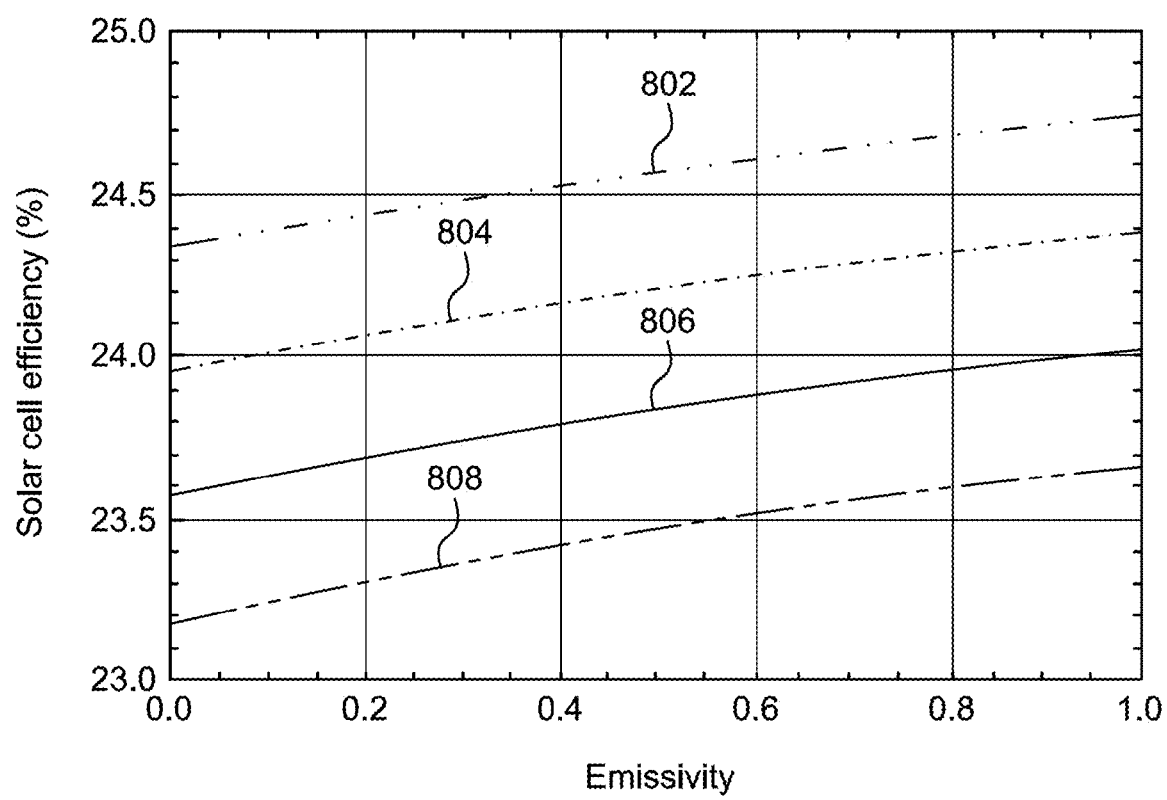
FIG. 8A is an illustration of a 10 mm×10 mm solar cell efficiency change with emissivity for concentration ration (CR)=500, according to aspects of the present disclosure.

In this experiment, system analysis for efficiency results of the HCPV of the present disclosure was performed. FIG. 8A shows the change in solar cell efficiency ($\eta$) with backplate pad material emissivity ($\varepsilon$, ranging from 0 to 1). Wind speed (v) was considered constant at the value of 2 m/s, and backplate pad thickness and the concentration ratio (CR) were t=4 mm and CR=500, respectively. FIG. 8A is an illustration of a 10 mm×10 mm solar cell efficiency change with emissivity for CR=500. Signal 802 shows the solar cell efficiency ($\eta$) with backplate pad material emissivity when the temperature is 20° C. Signal 804 shows the solar cell efficiency ($\eta$) with backplate pad material emissivity when the temperature is 30° C. Signal 806 shows the solar cell efficiency ($\eta$) with backplate pad material emissivity when the temperature is 40° C. Signal 808 shows the solar cell efficiency ($\eta$) with backplate pad material emissivity when the temperature is 50° C. The results showed that the efficiency increased by 1.64% as the backplate pad shifted from a shiny to a dark surface. This process occurred because of the thermal radiation exchange between the backplate pad 218 of the system 200 and the outside environment, which led to a reduction in solar cell temperature as shown in FIG. 8B.

Figure 8B:
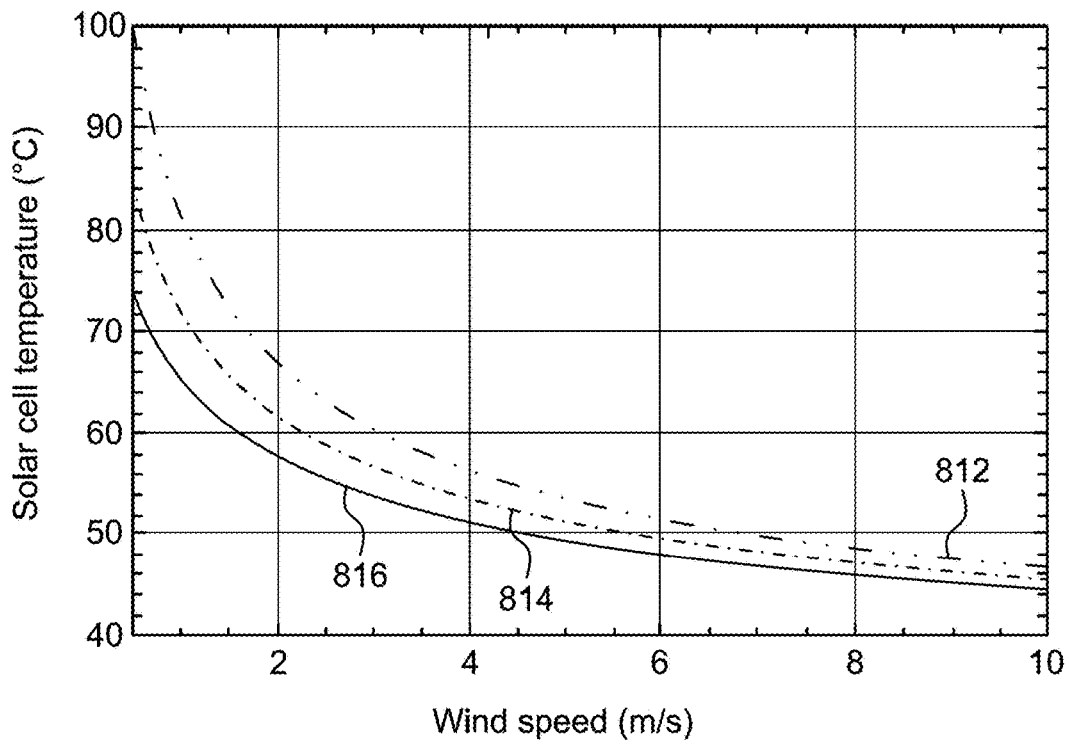
FIG. 8B is an illustration of a 10 mm×10 mm solar cell temperature change with wind speed for CR=500 at different plate thicknesses, according to aspects of the present disclosure.

FIG. 8B is an illustration of a 10 mm×10 mm solar cell temperature change with wind speed for CR=500. Signal 812 shows the solar cell temperature change with wind speed when the emissivity $\varepsilon$=0.05. Signal 814 shows the solar cell temperature change with wind speed when the emissivity $\varepsilon$=0.50. Signal 816 shows the solar cell temperature change with wind speed when the emissivity $\varepsilon$=0.95.

Figure 8C:
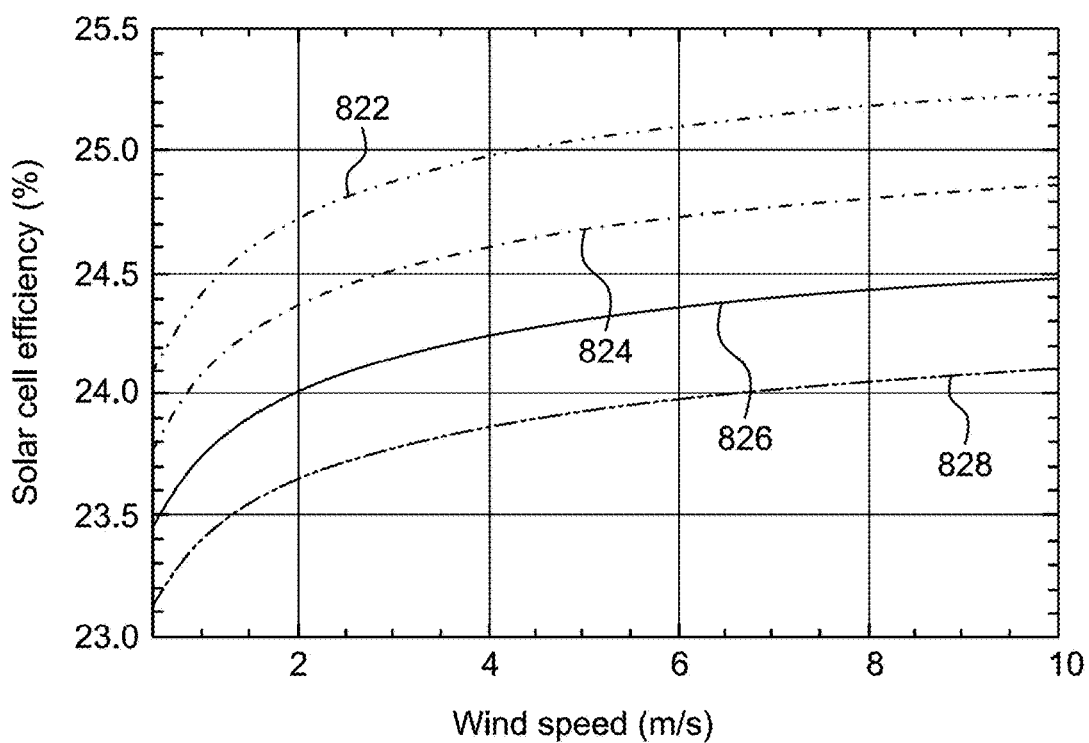
FIG. 8C is an illustration of a 10 mm×10 mm solar cell efficiency change with wind speed for CR=500, according to aspects of the present disclosure.

FIG. 8C is an illustration of a 10 mm×10 mm solar cell efficiency change with wind speed for CR=500. FIG. 8C shows the variation in solar cell efficiency with wind speed (v, ranging from 0 to 10 m/s) in the case of backplate pad emissivity and backplate pad thickness of $\varepsilon$=0.95 and t=4 mm, respectively. Higher wind speeds resulted in higher solar cell efficiencies. In a harsh environment, cell efficiency can reach as high as 24.1% for a wind velocity of 10 m/s. For the ambient temperature of 20° C., efficiency was increased from 24.1% to 25.25% (~5%) for the analyzed velocity limits. Signal 822 shows the solar cell efficiency ($\eta$) with wind speed when the temperature is 20° C. Signal 824 shows the solar cell efficiency ($\eta$) with wind speed when the temperature is 30° C. Signal 826 shows the solar cell efficiency ($\eta$) with wind speed when the temperature is 40° C. Signal 828 shows the solar cell efficiency ($\eta$) with wind speed when the temperature is 50° C.

Figure 8D:
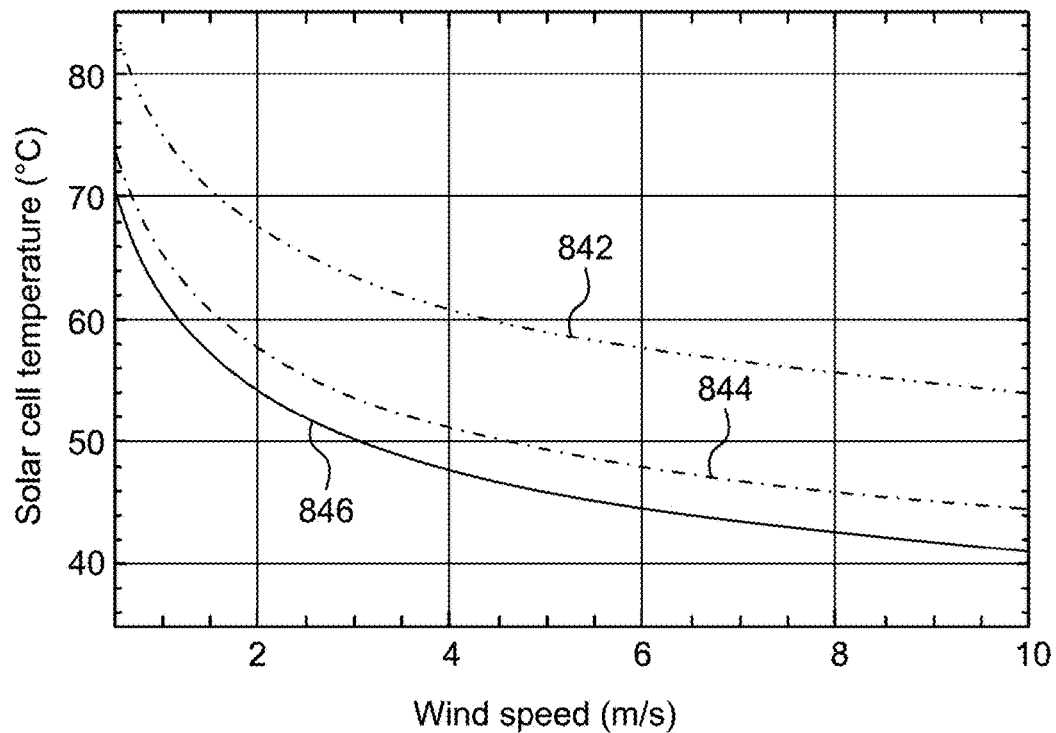
FIG. 8D is an illustration of a 10 mm×10 mm solar temperature change with wind speed for CR=500 at different emissivities, according to aspects of the present disclosure.

FIG. 8D is an illustration of a 10 mm×10 mm solar cell temperature with wind speed for CR=500. Signal 842 shows the solar cell temperature change with wind speed when the backplate pad thickness=0.02 mm. Signal 844 shows the solar cell temperature change with wind speed when the backplate pad thickness=0.04 mm. Signal 846 shows the solar cell temperature change with wind speed when the backplate pad thickness=0.06 mm. The effect of wind speed on solar cell temperature is shown in FIG. 8D, which clarifies the increment of cell efficiency with wind speed.

Figure 8E:
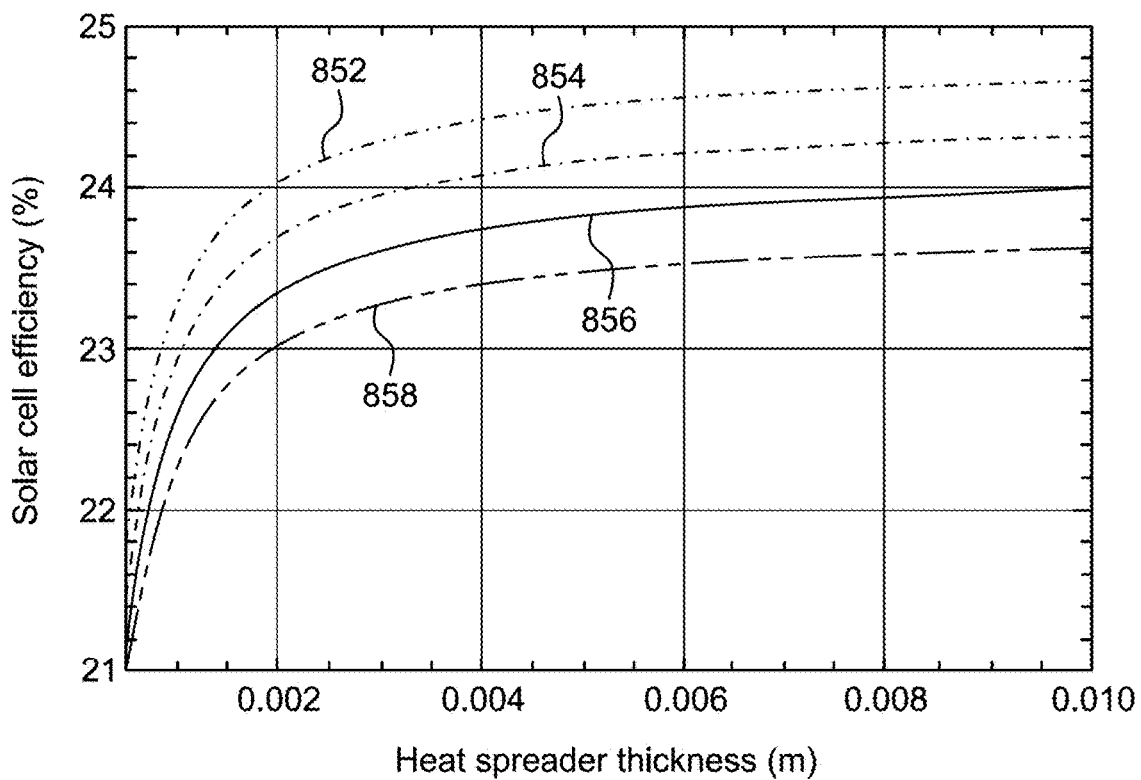
FIG. 8E is an illustration of a 10 mm×10 mm solar cell efficiency change with varying backplate pad thicknesses for CR=500, according to aspects of the present disclosure.

FIG. 8E is an illustration of a 10 mm×10 mm solar cell efficiency change with backplate pad thickness for CR=500. FIG. 8E considers the change in solar cell efficiency with backplate pad (head spreader) thickness (t ranging from 0 to 10 mm). Wind speed and backplate pad emissivity were kept constant at v=1 m/s and $\varepsilon$=0.95, respectively. It can be noticed that efficiency rapidly increased with increasing backplate pad thickness at lower values. Signal 852 shows the solar cell efficiency ($\eta$) with backplate pad thickness when the temperature is 20° C. Signal 854 shows the solar cell efficiency ($\eta$) with backplate pad thickness when the temperature is 30° C. Signal 856 shows the solar cell efficiency ($\eta$) with backplate pad thickness when the temperature is 40° C. Signal 858 shows the solar cell efficiency ($\eta$) with backplate pad thickness when the temperature is 50° C. However, the rate of increment may be neglected when backplate pad thickness exceeded 6 mm. This finding could also be confirmed by observing the effect of backplate pad thickness on the solar cell temperature, as shown in FIG. 8E.

Figure 9:
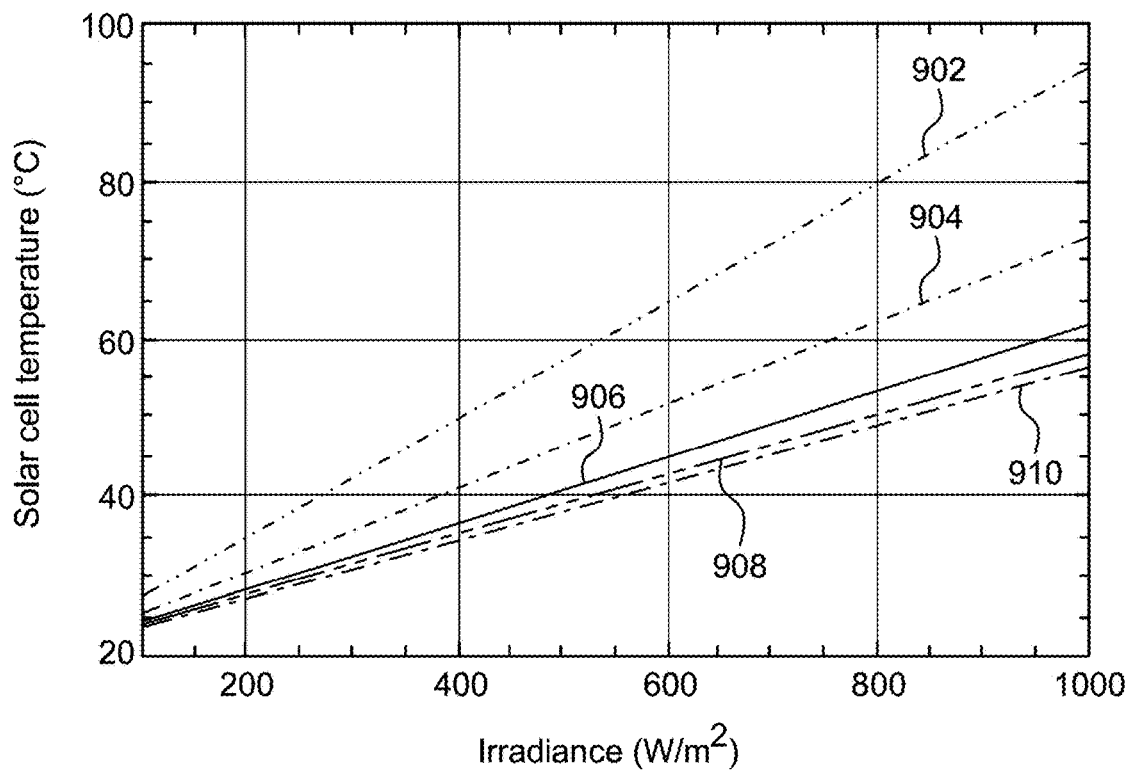
FIG. 9 is an illustration of solar temperature with irradiance for CR=500 at varying backplate pad thicknesses, according to aspects of the present disclosure.

FIG. 9 is an illustration of solar temperature with irradiance for CR=500. Signal 902 shows the solar cell temperature change with irradiance when the backplate pad thickness=0.01 mm. Signal 904 shows the solar cell temperature change with irradiance when the backplate pad thickness=0.02 mm. Signal 906 shows the solar cell temperature change with irradiance when the backplate pad thickness=0.04 mm. Signal 908 shows the solar cell temperature change with irradiance when the backplate pad thickness=0.06 mm. Signal 910 shows the solar cell temperature change with irradiance when the backplate pad thickness=0.08 mm.

Figure 10:
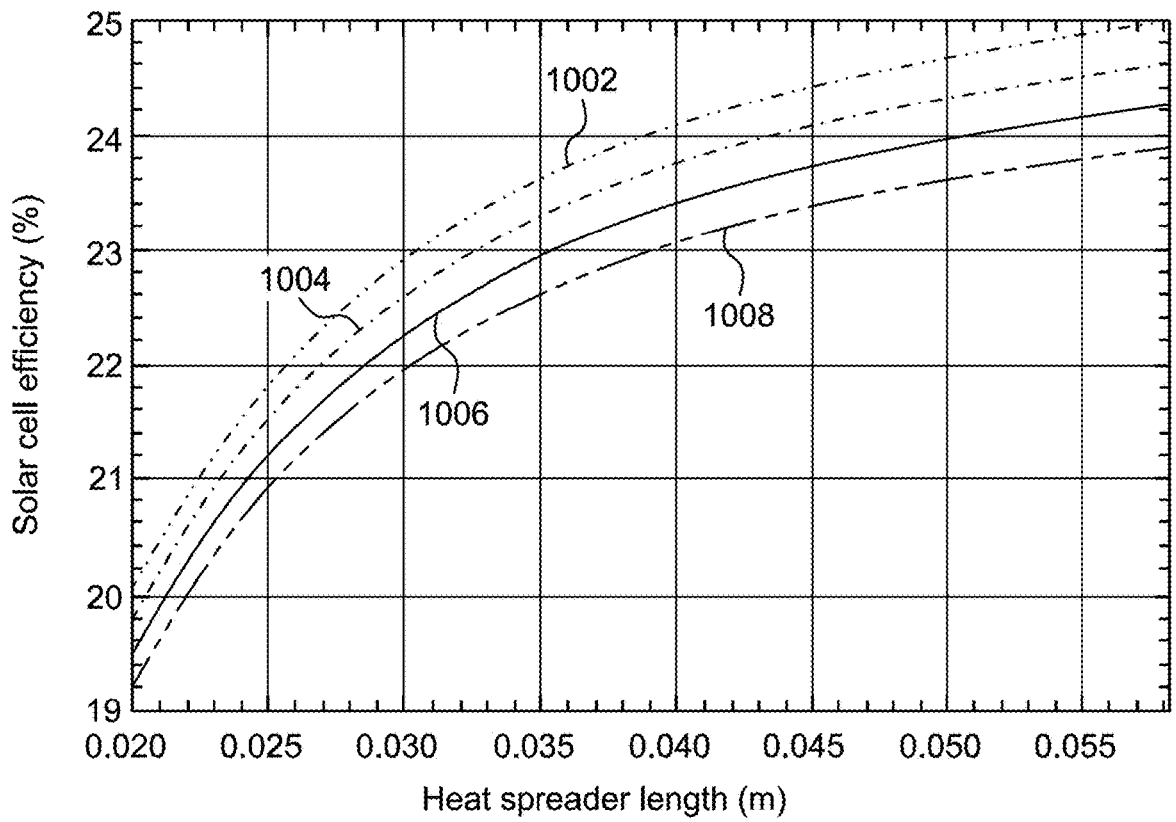
FIG. 10 is an illustration of a 3 mm×3 mm solar cell efficiency change with backplate pad length for CR=1500, according to aspects of the present disclosure.

FIG. 10 is an illustration of a 3 mm×3 mm solar cell efficiency change with backplate pad length for CR=1500. FIG. 10 indicates the change in solar cell efficiency with a backplate pad length (b ranging from 0.02 to 0.058 m) for the 3×3 mm cell size, t=4 mm, v=1 m/s, and $\varepsilon$=0.95. Signal 1002 shows the solar cell efficiency ($\eta$) with backplate pad length when the temperature is 20° C. Signal 1004 shows the solar cell efficiency ($\eta$) with backplate pad length when the temperature is 30° C. Signal 1006 shows the solar cell efficiency ($\eta$) with backplate pad length when the temperature is 40° C. Signal 1008 shows the solar cell efficiency ($\eta$) with backplate pad length when the temperature is 50° C. It can be noticed that efficiency logarithmically increased with increasing backplate pad length. This relationship hints that a value of b exists after which the efficiency will no longer increase.

Figure 11A:
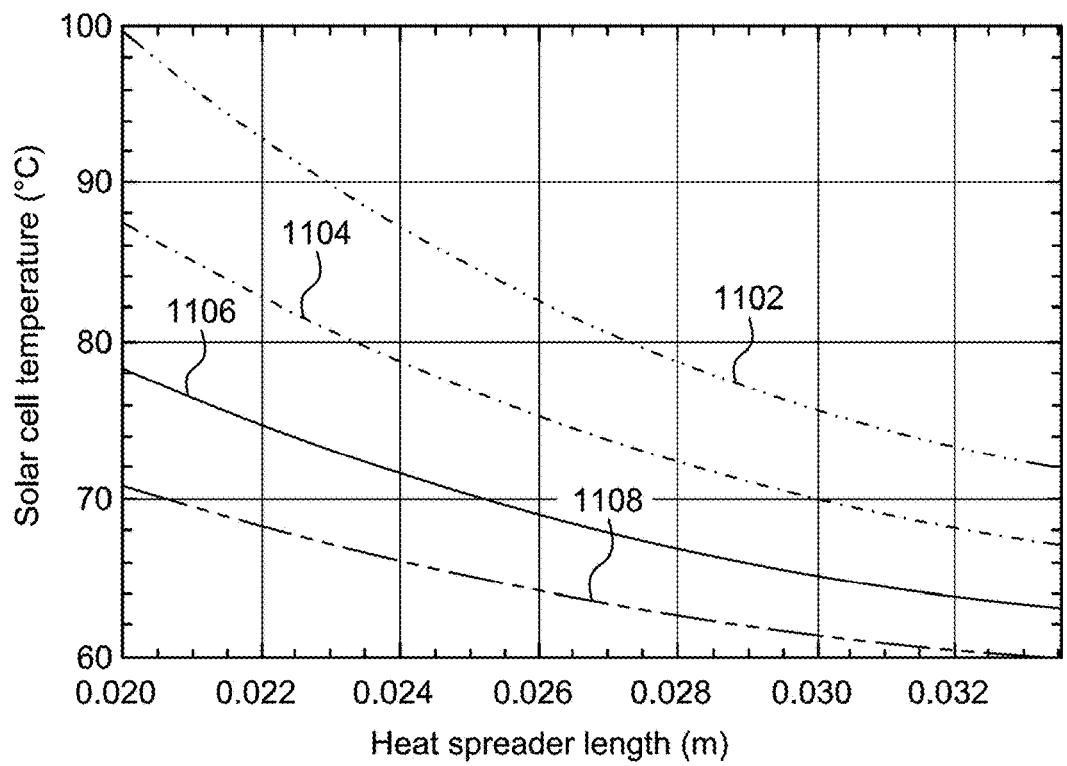
FIG. 11A is an illustration of a solar cell temperature with heat spreader length for CR=500, according to aspects of the present disclosure.
Figure 11B:
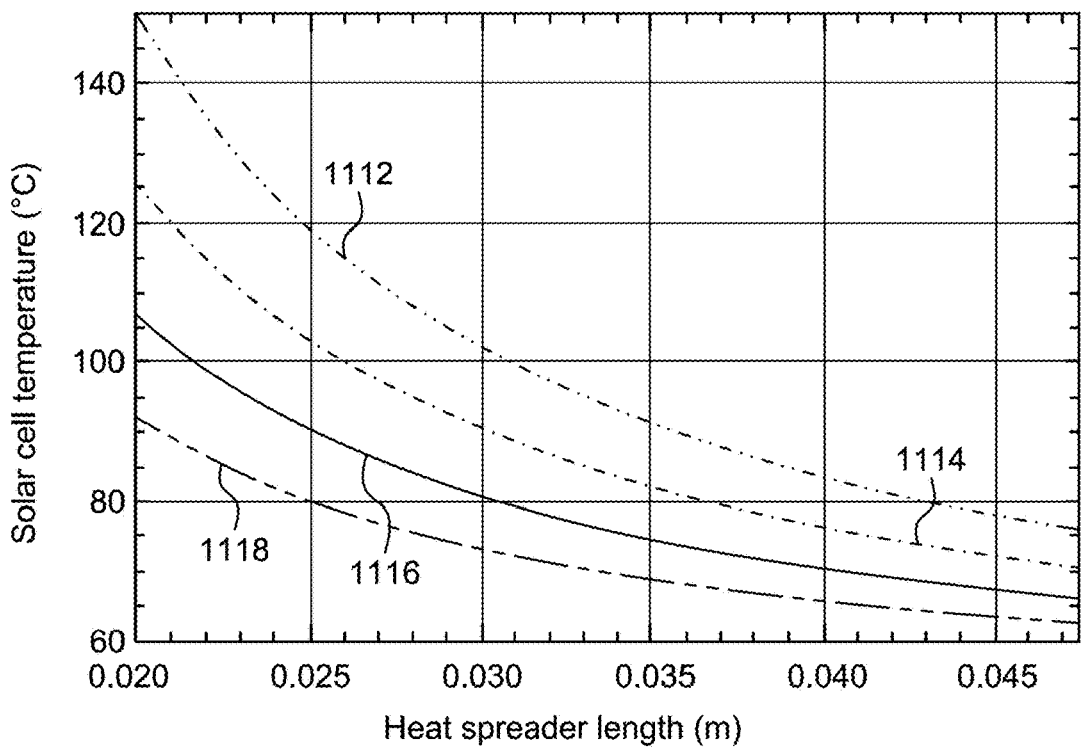
FIG. 11B is an illustration of a solar cell temperature with heat spreader length for CR=1000, according to aspects of the present disclosure.
Figure 11C:
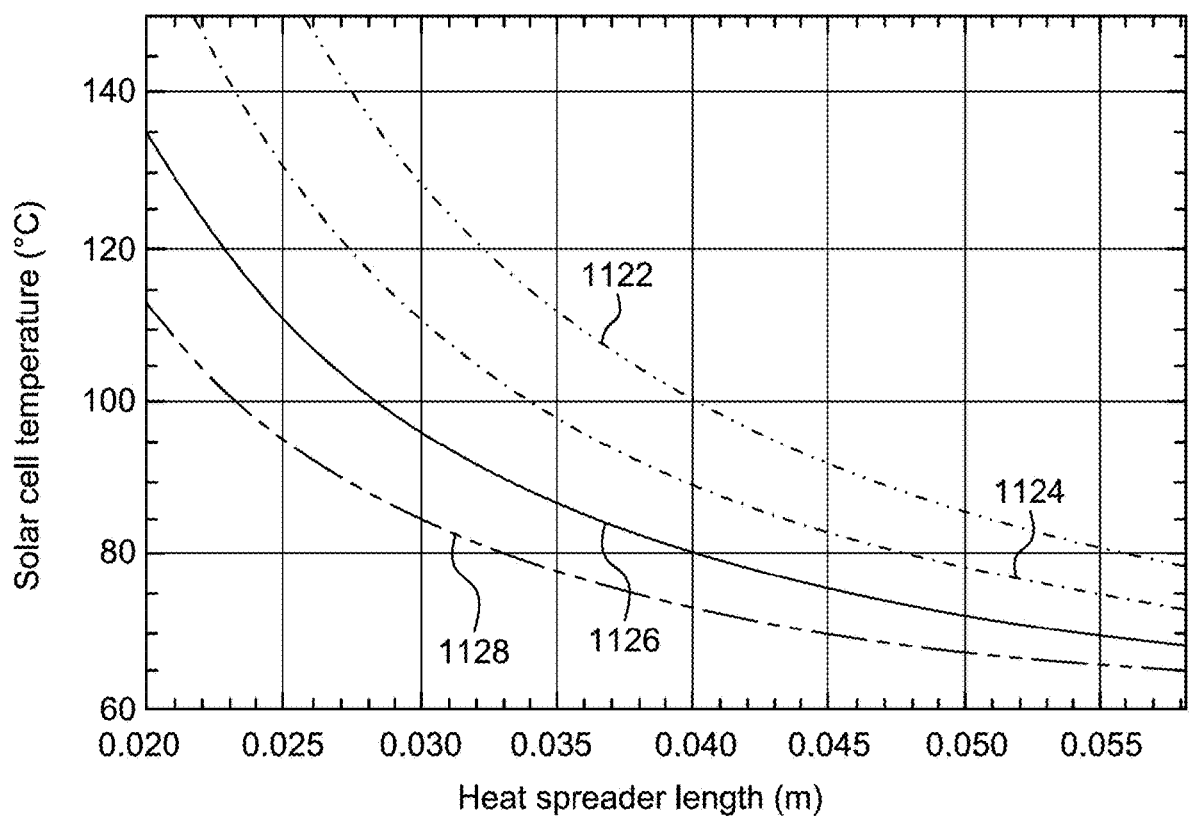
FIG. 11C is an illustration of a solar cell temperature with heat spreader length for CR=1500, according to aspects of the present disclosure.

The aluminum backplate pad 218 is used to absorb heat from the solar cell 208, spread it through the sheet, and then dissipate it by convection and surface radiation to the environment. The heat spreader (backplate pad) is incapable of rejecting sufficient amounts of heat when its size is small, thus leading to high solar cell temperature, as shown in FIGS. 11A, 11B, and 11C, which show the solar cell temperatures as a function of the backplate pad length for concentration ratios (CRs) 500, 1000, and 1500, respectively. FIG. 11A is an illustration of a solar cell temperature with heat spreader length for CR=500. Signal 1102 shows the solar cell efficiency ($\eta$) with backplate pad length when the wind speed value v=1 m/s. Signal 1104 shows the solar cell efficiency ($\eta$) with backplate pad length when the wind speed value v=2 m/s. Signal 1106 shows the solar cell efficiency (η) with backplate pad length when the wind speed value v=4 m/s. Signal 1108 shows the solar cell efficiency (η) with backplate pad length when the wind speed value v=8 m/s.

FIG. 11B is an illustration of a solar cell temperature with heat spreader (backplate pad) length for CR=1000. Signal 1112 shows the solar cell efficiency (η) with backplate pad length when the wind speed value v=1 m/s. Signal 1114 shows the solar cell efficiency (η) with backplate pad length when the wind speed value v=2 m/s. Signal 1116 shows the solar cell efficiency (η) with backplate pad length when the wind speed value v=4 m/s. Signal 1118 shows the solar cell efficiency (η) with backplate pad length when the wind speed value v=8 m/s.

FIG. 11C is an illustration of a solar cell temperature with heat spreader (backplate pad) length for CR=1500. Signal 1122 shows the solar cell efficiency (η) with backplate pad length when the wind speed value v=1 m/s. Signal 1124 shows the solar cell efficiency (η) with backplate pad length when the wind speed value v=2 m/s. Signal 1126 shows the solar cell efficiency (η) with backplate pad length when the wind speed value v=4 m/s. Signal 1128 shows the solar cell efficiency (η) with backplate pad length when the wind speed value v=8 m/s.

As the backplate pad size increased, a strong reduction in cell temperature could be observed, and its value dropped below the recommended operating temperature (80° C.), as shown in the figures. However, at large values of the backplate pad size, thermal constriction resistance became significant, which hindered the rejection of more heat to the environment. Increasing the size of the heat spreader (backplate pad) beyond such large values led to minor enhancement in its effectiveness and insignificant reductions in solar cell temperatures, specifically at high wind speed values, as shown in FIGS. 11A, 11B, and 11C. The size of the heat spreader at which the solar cell operates below the recommended temperature was found to increase with the concentration ratio (CR) and decrease with wind speed, as shown in FIGS. 11A, 11B, and 11C.

Fourth Experiment

Maximum Produced Power

Figure 12A:
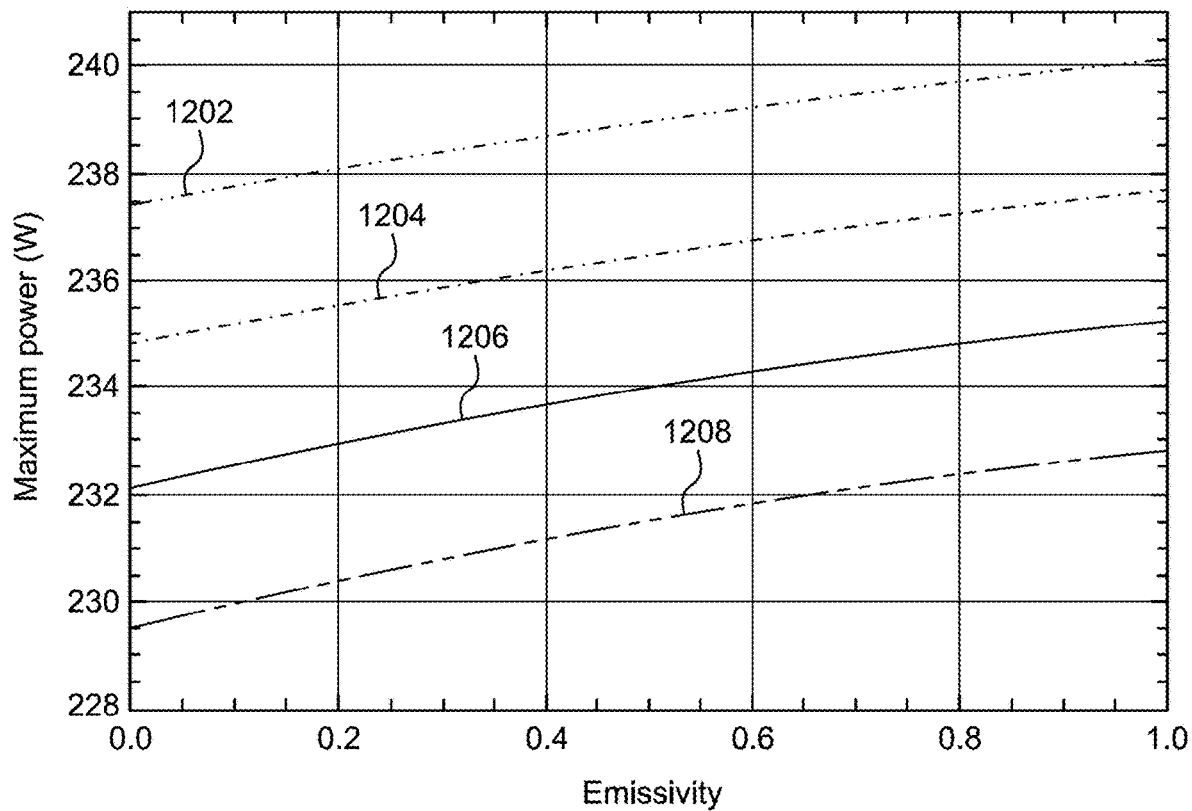
FIG. 12A is an illustration of a 10 mm×10 mm solar cell maximum power changes with emissivity, according to aspects of the present disclosure.

The HCPV of the present disclosure was implemented to study the effects of controlling parameters on the maximum produced power of the HCPV system 200. FIG. 12A shows the change in solar system power ($P_m$) with backplate pad material emissivity (ε ranging from 0 to 1) for the 10 mm×10 mm solar cell. FIG. 12A is an illustration of a 10 mm×10 mm solar cell maximum power changes with emissivity. Signal 1202 shows the maximum power changes with emissivity when the temperature is 20° C. Signal 1204 shows the maximum power changes with emissivity when the temperature is 30° C. Signal 1206 shows the maximum power changes with emissivity when the temperature is 40° C. Signal 1208 shows the maximum power changes with emissivity when the temperature is 50° C. Wind speed (v) and backplate pad thickness were considered constant at 2 m/s and t=4 mm. Maximum power steadily increased with higher values of emissivity, as shown in the FIG. 12A. As the emissivity increased from 0 to 1, the maximum power increased by 1.16% and 1.46% for 20° C. and 50° C., respectively. This process occurred because surface radiation is more significant at high values of temperatures.

Figure 12B:
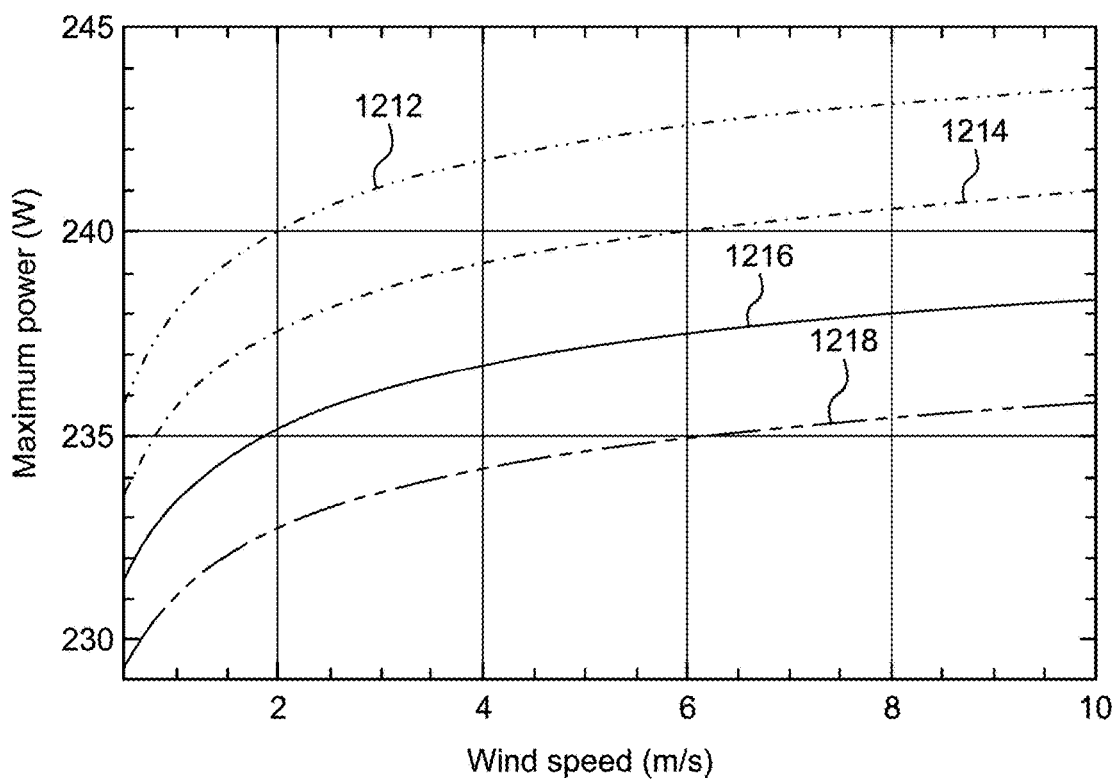
FIG. 12B is an illustration of a 10 mm×10 mm solar cell maximum power change with wind speed, according to aspects of the present disclosure.

FIG. 12B shows the change in solar cell maximum power ($P_m$) with wind speed (v, ranging from 0 to 10 m/s) in the case of backplate pad emissivity and backplate pad thickness of ε=0.95 and t=4 mm, respectively, for the 10 mm×10 mm cell. Signal 1212 shows the maximum power changes with wind speed when the temperature is 20° C. Signal 1214 shows the maximum power changes with wind speed when the temperature is 30° C. Signal 1216 shows the maximum power changes with wind speed when the temperature is 40° C. Signal 1218 shows the maximum power changes with wind speed when the temperature is 50° C. Higher wind speeds resulted in higher extracted power, for which the increment can be up to 3.2% as the convection mode shifted from pure free to pure forced convection.

Figure 12C:
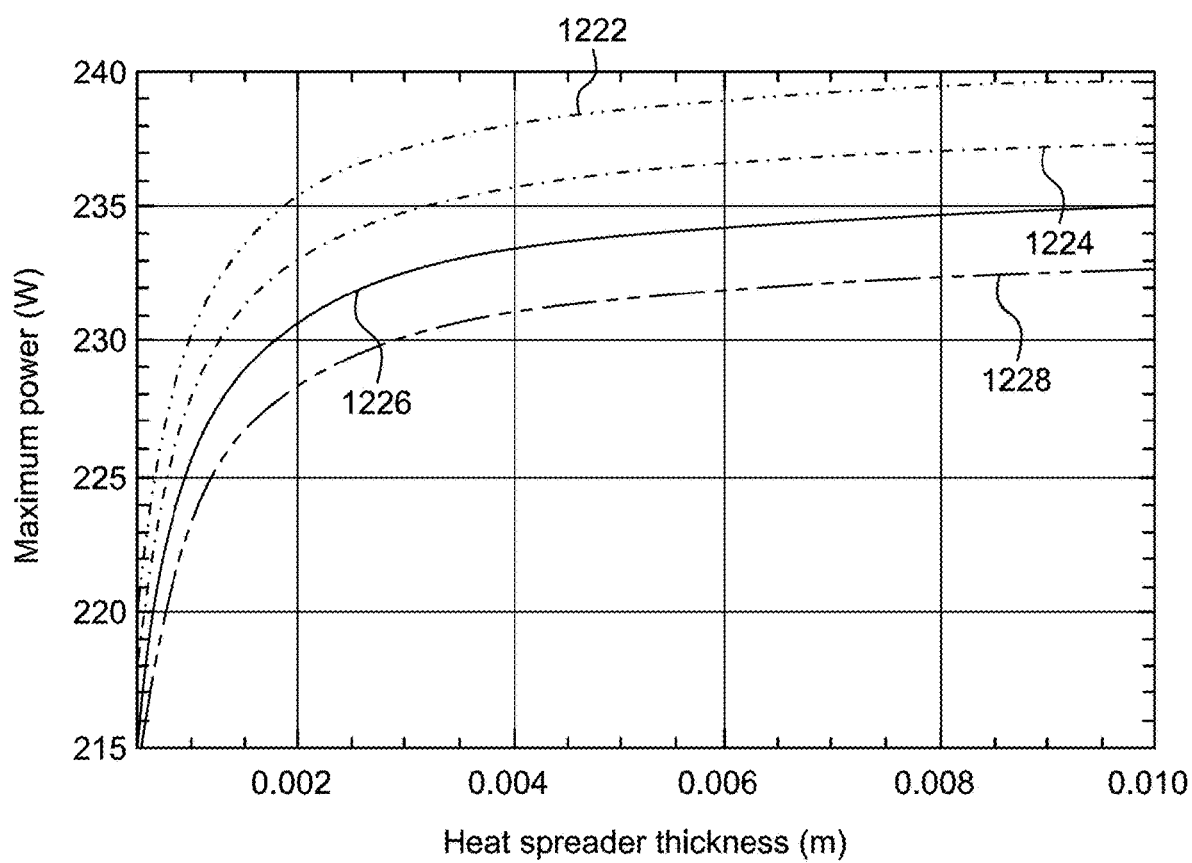
FIG. 12C is an illustration of a 10 mm×10 mm solar cell maximum power change with backplate pad thickness, according to aspects of the present disclosure.

FIG. 12C is an illustration of a 10 mm×10 mm solar cell maximum power change with backplate pad thickness. FIG. 12C considers the change in solar system maximum power concerning backplate pad thickness (t ranging from 0 to 10 mm) for the 10 mm×10 mm cell. Signal 1222 shows the maximum power changes with backplate pad thickness when the temperature is 20° C. Signal 1224 shows the maximum power changes with backplate pad thickness when the temperature is 30° C. Signal 1226 shows the maximum power changes with backplate pad thickness when the temperature is 40° C. Signal 1228 shows the maximum power changes with backplate pad thickness when the temperature is 50° C. Wind velocity and backplate pad emissivity were kept constant at v=1 m/s and ε=0.95, respectively. It could be noticed that maximum power rapidly increased with increasing backplate pad thickness at lower values. However, the increment of power became almost negligible when the thickness exceeded 6 mm.

Figure 13:
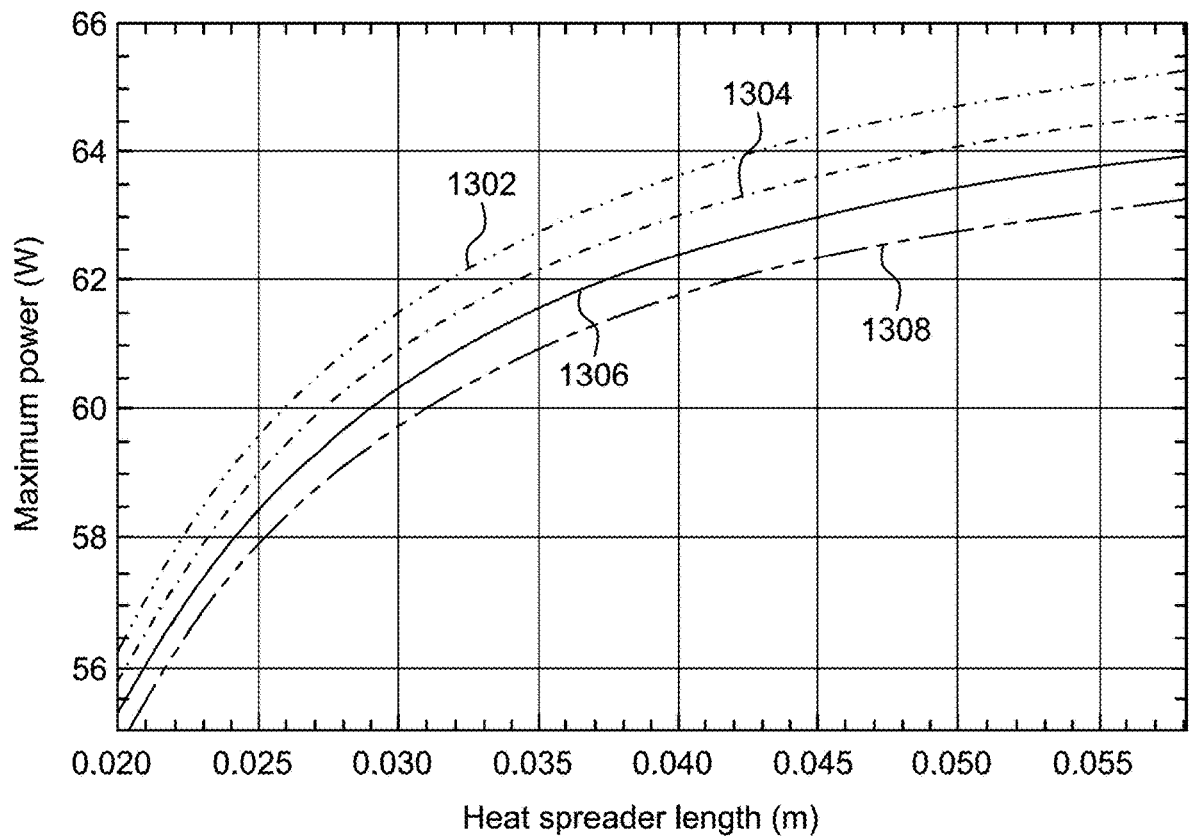
FIG. 13 is an illustration of a 3×3 mm solar cell maximum power change with backplate pad length, according to aspects of the present disclosure.

FIG. 13 is an illustration of a 3×3 mm solar cell maximum power change with backplate pad length. FIG. 13 shows the change in the solar system produced power with a backplate pad length (b ranging from 0.02 to 0.058 m) for the 3×3 mm size with t=4 mm. Signal 1302 shows the maximum power changes with backplate pad length when the temperature is 20° C. Signal 1304 shows the maximum power changes with backplate pad length when the temperature is 30° C. Signal 1306 shows the maximum power changes with backplate pad length when the temperature is 40° C. Signal 1308 shows the maximum power changes with backplate pad length when the temperature is 50° C. Wind velocity and backplate pad emissivity were kept constant at v=1 m/s and ε=0.95, respectively. The increase in power was significant at low values of b; however, it became insignificant at high values of b.

Fifth Experiment

Power Consumption of the Tracking System

Figure 14:
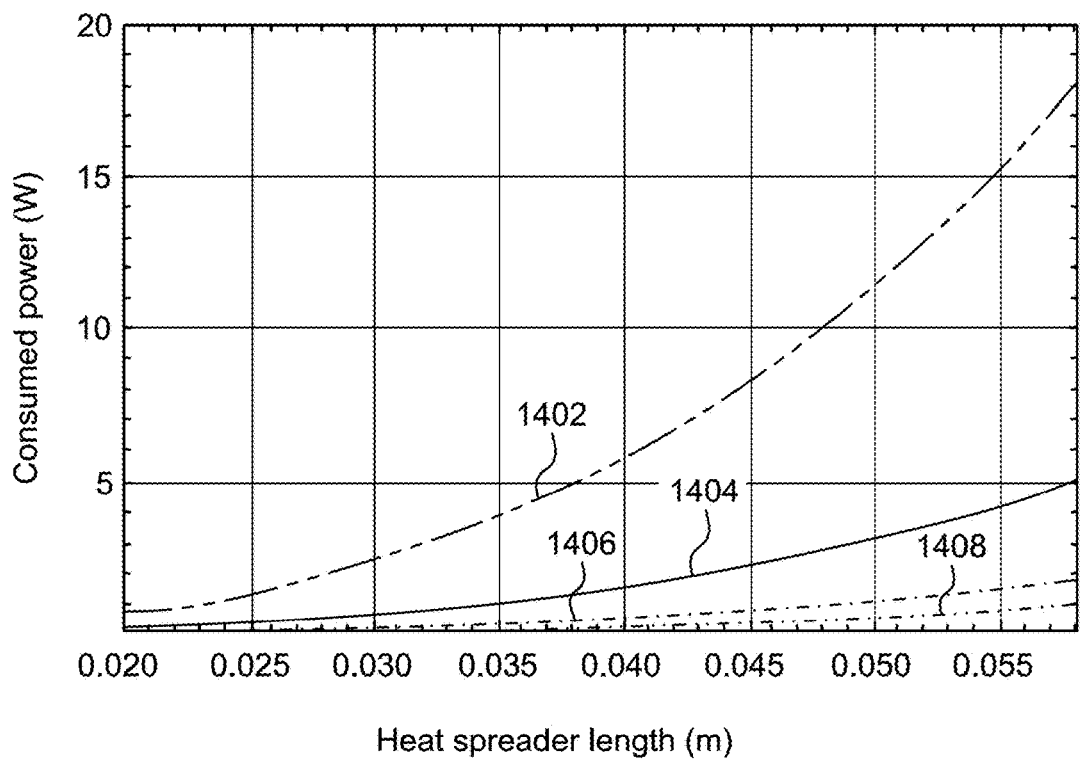
FIG. 14 is an illustration of a tracking system power consumption change with backplate pad length, according to aspects of the present disclosure.

FIG. 14 is an illustration of a tracking system power consumption change with backplate pad length. FIG. 14 shows the tracking system power consumption with a backplate pad length (b, ranging from 0.02 to 0.058 m) in the a 3×3 mm size with t=4 mm. Solar tracker angular velocity, angular acceleration, and moment coefficients were considered to be 60 rpm, 0.1 rad/s2, and 0.35, respectively. Four wind velocities were considered, namely 1, 2, 4, and 8 m/s. Signal 1402 shows the consumed power with backplate pad length when the wind speed value v=1 m/s. Signal 1404 shows the consumed power with backplate pad length when the wind speed value v=2 m/s. Signal 1406 shows the consumed power with backplate pad length when the wind speed value v=4 m/s. Signal 1408 shows the consumed power with backplate pad length when the wind speed value v=8 m/s.

It could be noticed that the higher the wind, the more consumed power with a tracking system occurred. This behavior follows a power law of the pattern $P_c=zb^x$, in which z and x are wind speed-dependent constants. Thus, a slight reduction in backplate pad size could result in a considerable reduction in power losses due to tracking system operation, especially during periods of high wind velocity.

Sixth Experiment

Net Power

To explore the effects of the heat spreader (backplate pad) size on the net power of the system 100, the ratio of net power at any value of backplate pad length (b) to the net power when $b=b_{fl}$ (to the system design) was introduced as a function of backplate pad length ratio ($b_r=b/b_{fl}$). In this experiment, the effects of length of the backplate pad on the net power for 3 mm×3 mm solar cells at different values of input parameters, namely the backplate pad thickness, ambient temperature, incident radiation, concentration ratio (CR), and wind speed, were observed.

Figure 15A:
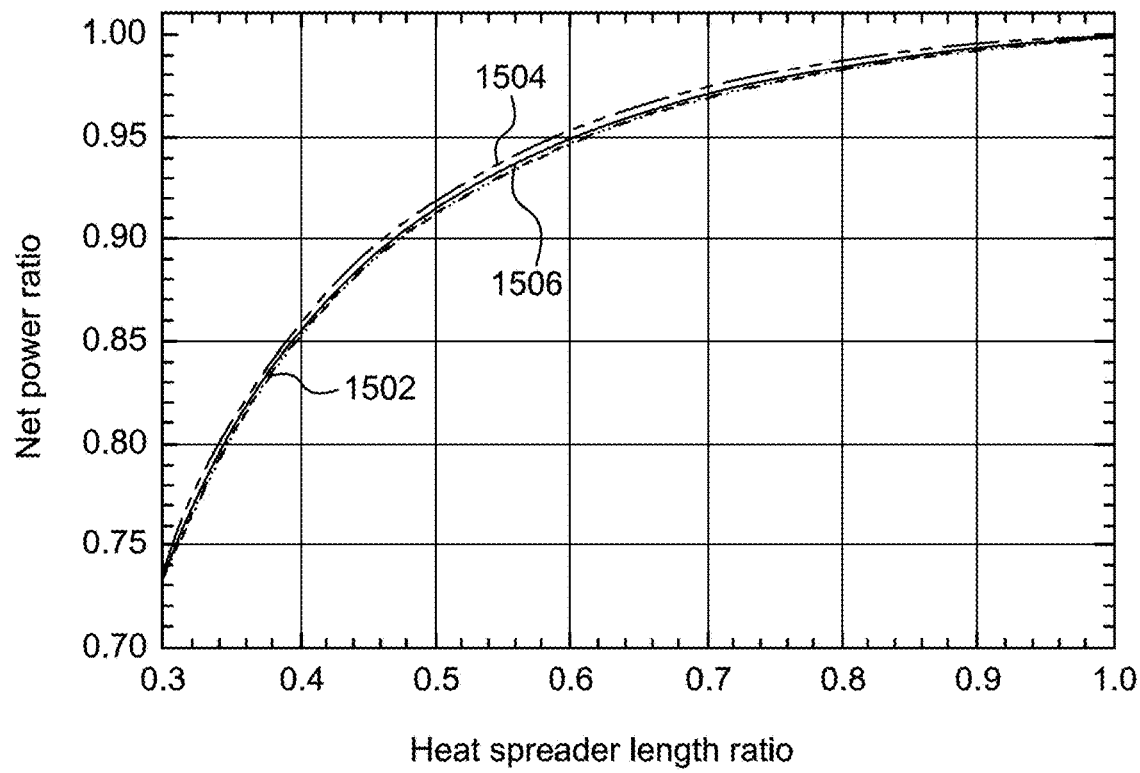
FIG. 15A is an illustration of a 3 mm×3 mm solar cell net power ratio with backplate pad length ratio at v=0.5 m/s, according to aspects of the present disclosure.
Figure 15B:
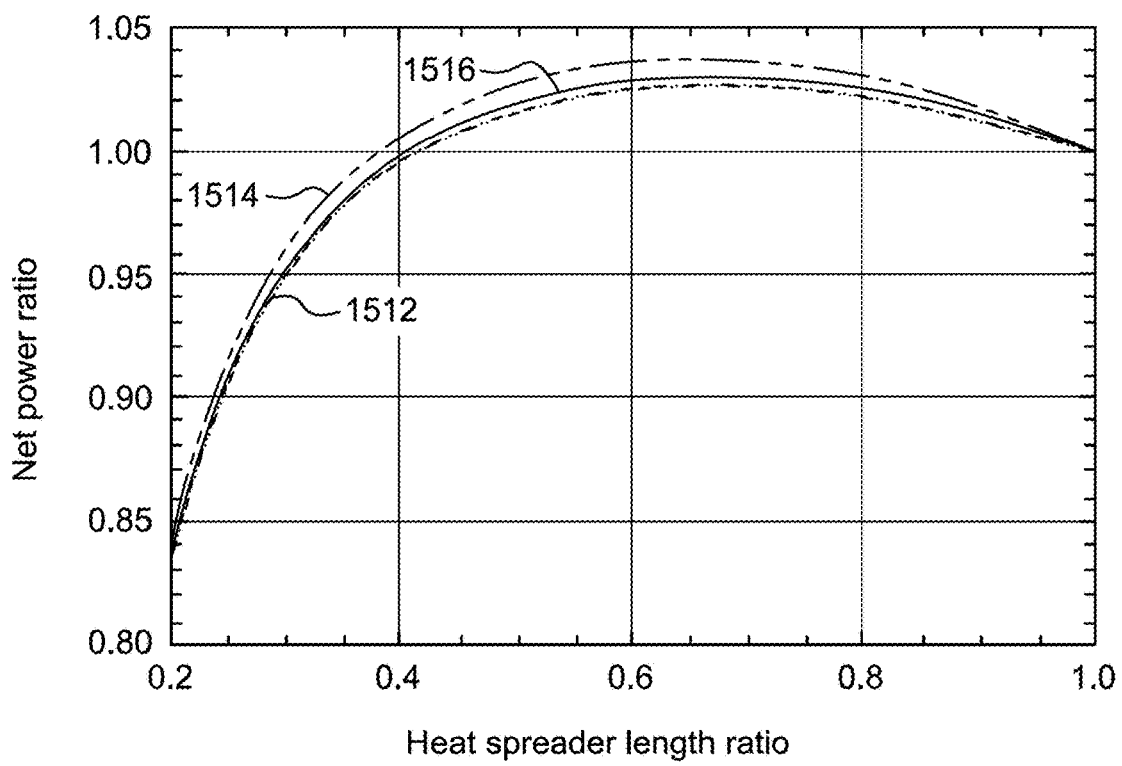
FIG. 15B is an illustration of a 3 mm×3 mm solar cell net power ratio with backplate pad length ratio at v=4 m/s, according to aspects of the present disclosure.

The net power ratio of the HCPV system 200 as a function of backplate pad length ratio, for the 3×3 mm cell size at an ambient temperature of 20° C., $\varepsilon=0.95$, I=1000 W/m2, and CR=1500 is shown in FIGS. 15A and 15B for wind speeds of 0.5 and 4 m/s, respectively. Four backplate pad thicknesses were considered: 1, 2, 4, and 8 mm. FIG. 15A is an illustration of a 3 mm×3 mm solar cell net power ratio with backplate pad length ratio at v=0.5 m/s. Signal 1502 shows the solar cell temperature change with wind speed when the backplate pad thickness=1 mm or 2 mm. Signal 1504 shows the solar cell temperature change with wind speed when the backplate pad thickness=8 mm. Signal 1506 shows the solar cell temperature change with wind speed when the backplate pad thickness=6 mm. In FIG. 15A, with v=0.5 m/s, the results showed that the net power ratio is always <1 for all values of b ($a<b\leq b_{fl}$). These observations indicate that at such values of low wind speed, the design of the system (using the full size of the backplate pad) produces higher net power.

However, at the higher wind speed of v=4 m/s, as shown in FIG. 15B, the results show that the net power ratio increased with b until reaching a maximum value followed by a decrease due to the increase in power consumed by the tracking system. FIG. 15B is an illustration of a 3 mm×3 mm solar cell net power ratio with backplate pad length ratio at v=4 m/s. Signal 1512 shows the solar cell temperature change with wind speed when the backplate pad thickness=0.01 mm or 0.02 mm. Signal 1514 shows the solar cell temperature change with wind speed when the backplate pad thickness=0.06 mm or 0.08 mm. Signal 1516 shows the solar cell temperature change with wind speed when the backplate pad thickness=0.04 mm.

This process occurred because as b increased starting at low values, the increment in produced power due to the reduction in cell temperature was much more than the increment in power consumed by the tracking system. However, at high values of b, the thermal constriction of flux lines was higher, which reduced the effectiveness of the backplate pad as a heat spreader. Thus, the improvement in produced power by increasing b at these high values of b was insignificant since the produced power increased logarithmically with b. On the other hand, the consumed power by the solar tracker increased exponentially with backplate pad length, and the degree of exponentiality increased with increasing wind velocity. Thus, at moderate and high wind speed values, a value of $b<b_{fl}$ at which net power becomes maximum could be found. This value is important to system designers since it gives maximum net power and reduces the system's initial cost at the same time. In the present example pertinent to FIG. 15B, the net power reached a peak at around $b_r=0.65$ for all thickness values then decreased. This finding indicates that maximum pure power value could be reached while saving 58% of the backplate pad area.

Figure 16A:
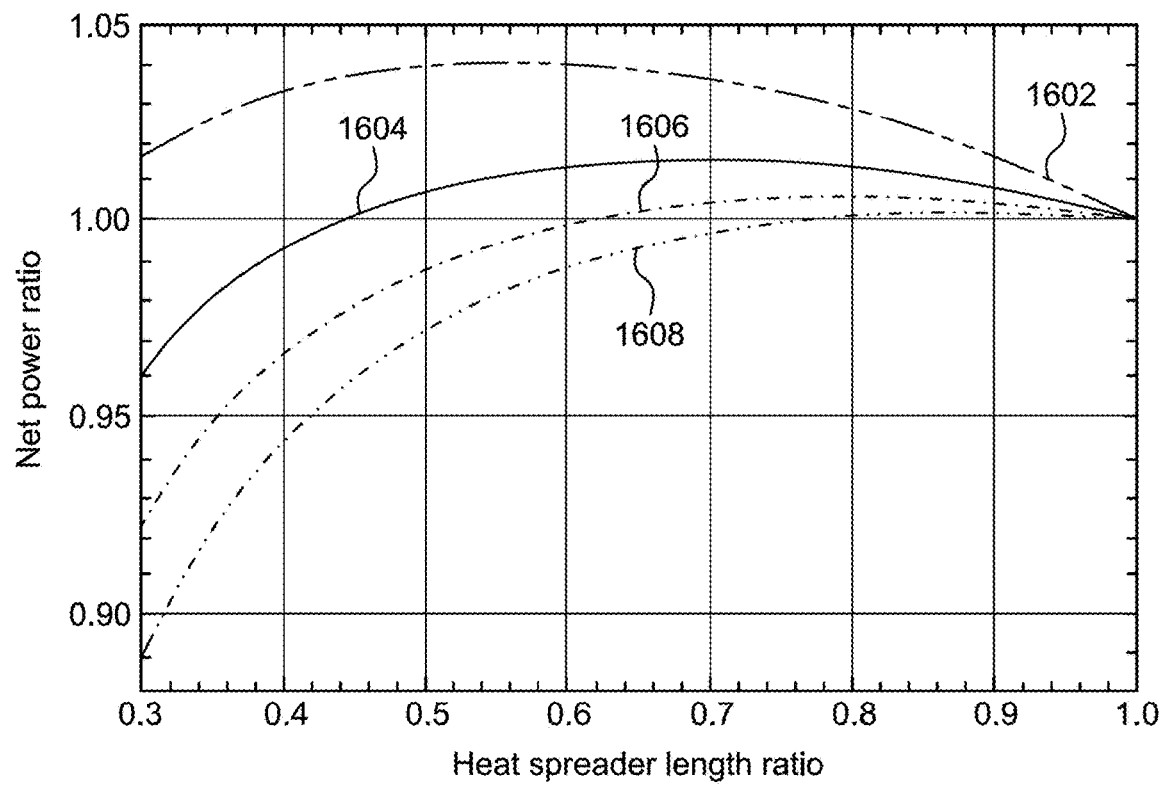
FIG. 16A is an illustration of a 3×3 mm solar cell net power change with backplate pad length for different values of plate thickness, according to aspects of the present disclosure.

The effects of the incident radiation, ambient temperature, concentration ratio (CR), and wind speed on the maximum net power and its associated backplate pad length are shown in FIGS. 16A-16D, respectively. It was concluded that the incident radiation had a strong impact on the maximum net power and associated backplate pad length, as shown in FIG. 16A. FIG. 16A is an illustration of a 3×3 mm solar cell net power change with backplate pad length for different values of backplate pad thickness. Signal 1602 shows a net power ratio when the direct normal irradiance I=300 W/m². Signal 1604 shows the net power ratio when the direct normal irradiance I=500 W/m². Signal 1606 shows the net power ratio when the direct normal irradiance I=700 W/m². Signal 1608 shows the net power ratio when the direct normal irradiance/=900 W/m².

As the incident radiation increased, the backplate pad length at which maximum net power was achieved occurred at larger values of b with lower maximum net power. For the example pertinent to FIG. 16A, the maximum net power occurred at length ratio 0.9, 0.8, 0.7, and 0.55 with net power ratio 1.002, 1.008, 1.015, and 1.04 for I=900, 700, 500, and 300 W/m², respectively. Thus, a reduction in heat spreader area by 19%, 36%, 51%, and 70% for I=900, 700, 500, and 300 W/m², respectively, may be achieved. At the same time, enhancement in the net power may be obtained by 0.2%, 0.8%, 1.5%, and 4% for I=900, 700, 500, and 300 W/m², respectively.

Figure 16B:
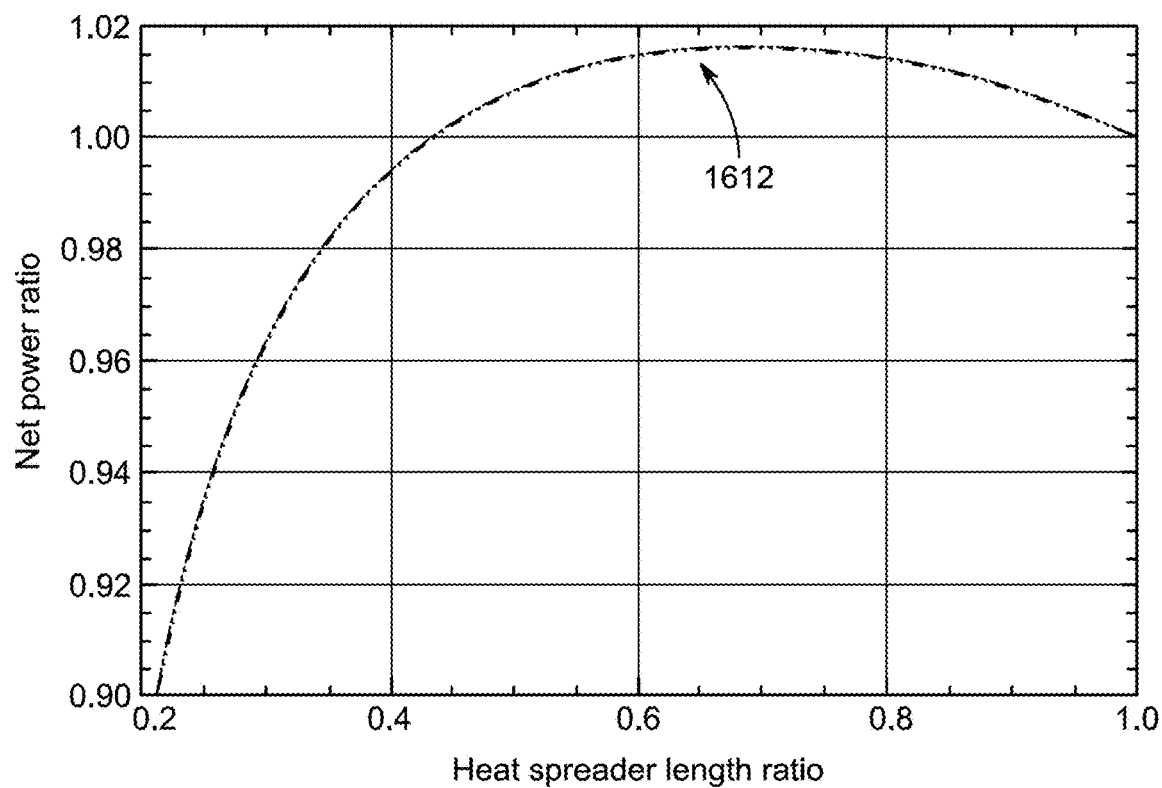
FIG. 16B is an illustration of a 3×3 mm solar cell net power change with backplate pad length for different values of ambient temperature, according to aspects of the present disclosure.

FIG. 16B is an illustration of a 3×3 mm solar cell net power change with backplate pad length for different values of ambient temperature. Signal 1612 shows the solar cell net power change with backplate pad length when the temperature changes. FIG. 16B shows that the ambient temperature did not affect the maximum net power nor its associated backplate pad length.

Figure 16C:
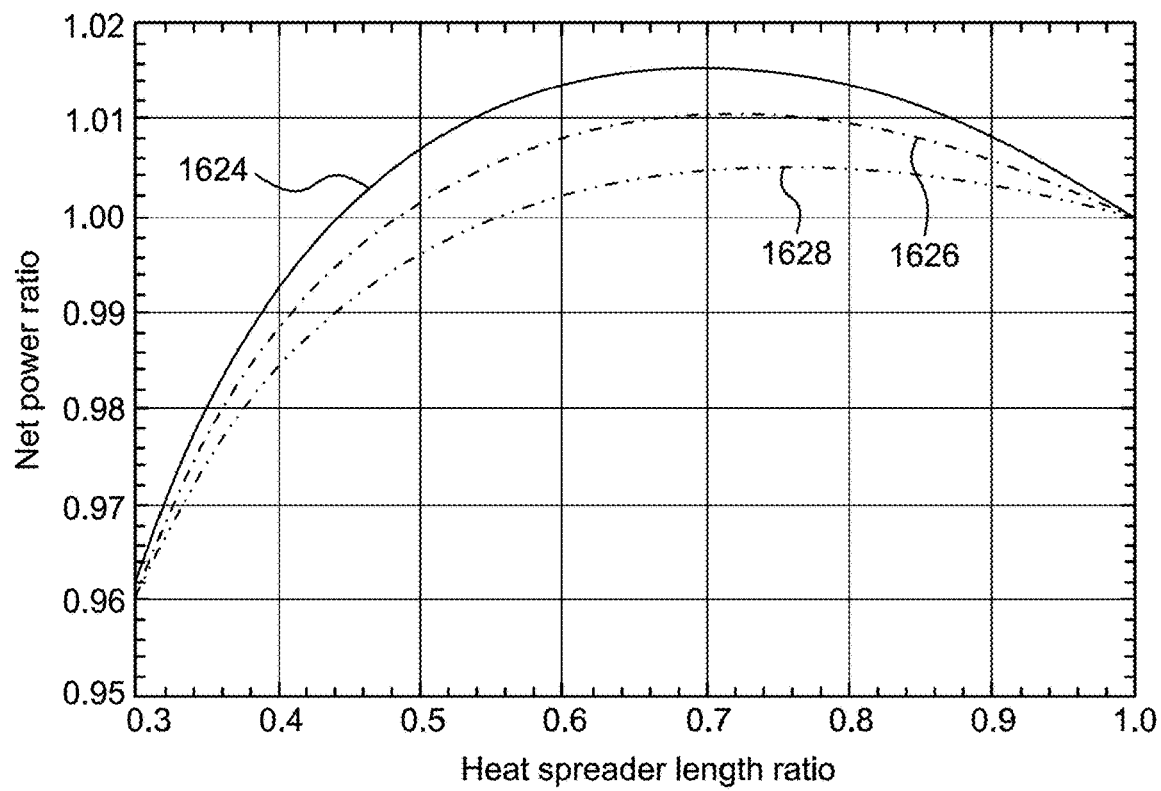
FIG. 16C is an illustration of a 3×3 mm solar cell net power change with backplate pad length for different values of concentration ratios (CR), according to aspects of the present disclosure.

On the other hand, the concentration ratio (CR) was found to have a noticeable effect on the maximum net power and a small effect on its associated backplate pad length, as shown in FIG. 16C. FIG. 16C is an illustration of a 3×3 mm solar cell net power change with backplate pad length for different values of CR. Signal 1624 shows solar cell net power change with backplate pad length for CR=1500. Signal 1626 shows the solar cell net power change with backplate pad length for CR=1000. Signal 1628 shows the solar cell net power change with backplate pad length for CR=500.

Figure 16D:
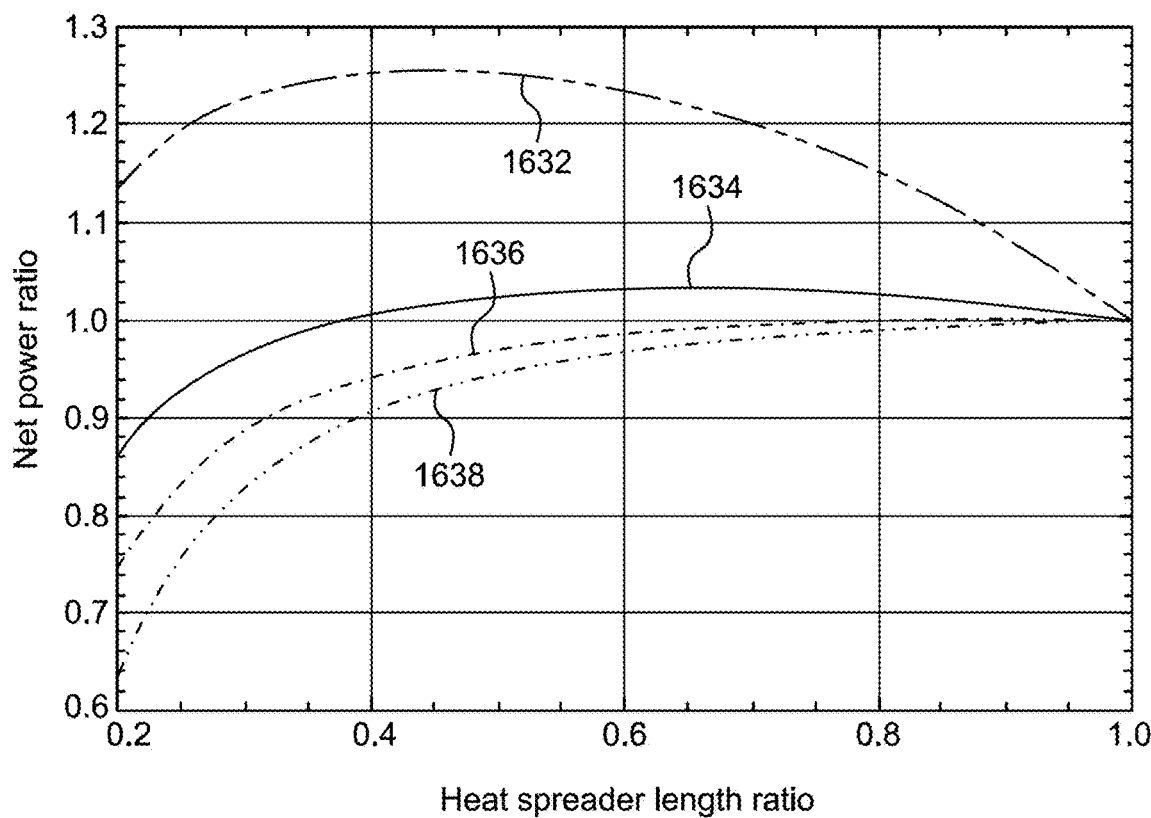
FIG. 16D is an illustration of a 3×3 mm solar cell net power change with backplate pad length for different values of wind speed, according to aspects of the present disclosure.

In contrast, wind speed significantly influenced both maximum net power and its associated length, as shown in FIG. 16D. FIG. 16D is an illustration of a 3×3 mm solar cell net power change with backplate pad length for different values of wind speed. At extremely low values of speed ($v\leq 1$ m/s), no length existed, and the system required the full backplate pad length to produce maximum net power. However, at v=2 m/s, the net power increased with backplate pad length until it became constant at $b_r=0.7$, indicating that 51% of backplate pad area was enough to produce the same amount of net power at full backplate pad size. For moderate and high wind speeds, a significant decrease in the backplate pad length needed to produce the maximum net power was observed with a significant increment in net power ratio, as shown in FIG. 16D. Signal 1632 shows the solar cell net power change with backplate pad length when the wind speed value v=8 m/s. Signal 1634 shows the solar cell net power change with backplate pad length when the wind speed value v=4 m/s. Signal 1636 shows the solar cell net power change with backplate pad length when the wind speed value v=2 m/s. Signal 1638 shows the solar cell net power change with backplate pad length when the wind speed value v=1 m/s. The figure shows that 64% and 80% reductions in backplate pad area and 4% and 25.7% increments in net power could be obtained by designing the system at a backplate pad length for wind speeds of 4 and 8 m/s, respectively.

As stated above, wind velocity and solar irradiance have the greatest effect on backplate pad length and maximum net power. However, these two parameters have assertive fluctuating behavior during the day and also the year. Thus, it will be practical to design the HCPV system 200 based on the average annual parameters at the site. A case study is present to design an HCPV system 200 in two cities in Saudi Arabia, namely Riyadh and Dammam, based on the hourly-basis meteorological data recorded by the two solar resources monitoring stations located in King Saud University in Riyadh and Imam Abdulrahman Bin Faisal University in Dammam.

Case Study for Riyadh and Dammam Cities

The average direct normal irradiance, wind speed, wind direction, and ambient temperature were calculated from the hourly basis meteorological data recorded by the two solar resource monitoring stations located in King Saud University in Riyadh and Imam Abdulrahman Bin Faisal University in Dammam. The calculated data was used as input to obtain a heat spreader (backplate pad) length and the net power ratio for a twenty-five solar cell system. These average values were obtained by calculating the average of the values of those parameters from sunrise to sunset for a time period. The average values of the meteorological parameters for the two cities are shown in Table 1. Another factor that needs to be considered when determining the size of the heat spreader is the maximum operating temperature limit set for the CPV system by the manufacturer. The maximum operating temperature provided by the manufacturer of the multi-junction solar cell is 110° C. Thus, the operating temperature of the solar cell under the worst meteorological conditions (maximum incident radiation and ambient temperature and minimum wind speed) in Riyadh and Dammam should always be below the maximum operating limit when selecting the size of the heat spreader. The maximum registered incident radiation and ambient temperature, and minimum wind speed in Riyadh and Dammam are shown in Table 1.

of this difference, the backplate pad length ratio at which the system produced the highest net power in Dammam was smaller than that in Riyadh.

Figure 17A:
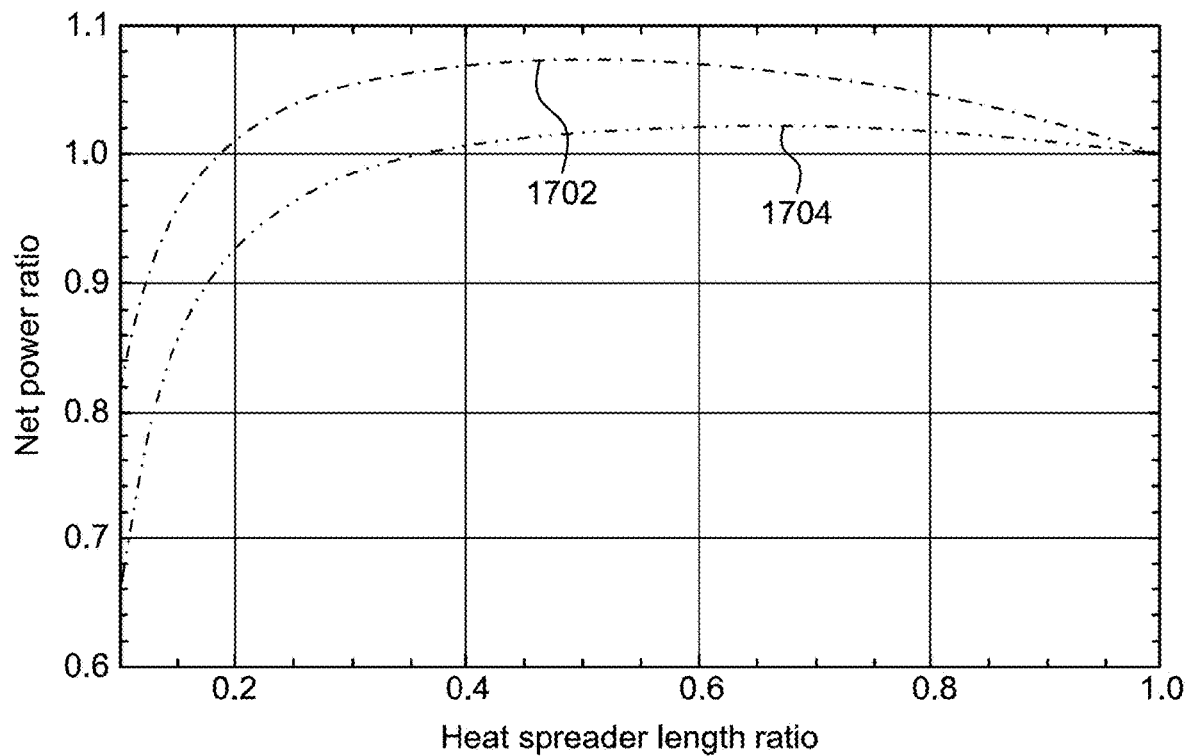
FIG. 17A is a net power ratio as a function of the backplate pad length for the two cities at t=0.002 mm, according to aspects of the present disclosure.
Figure 17B:
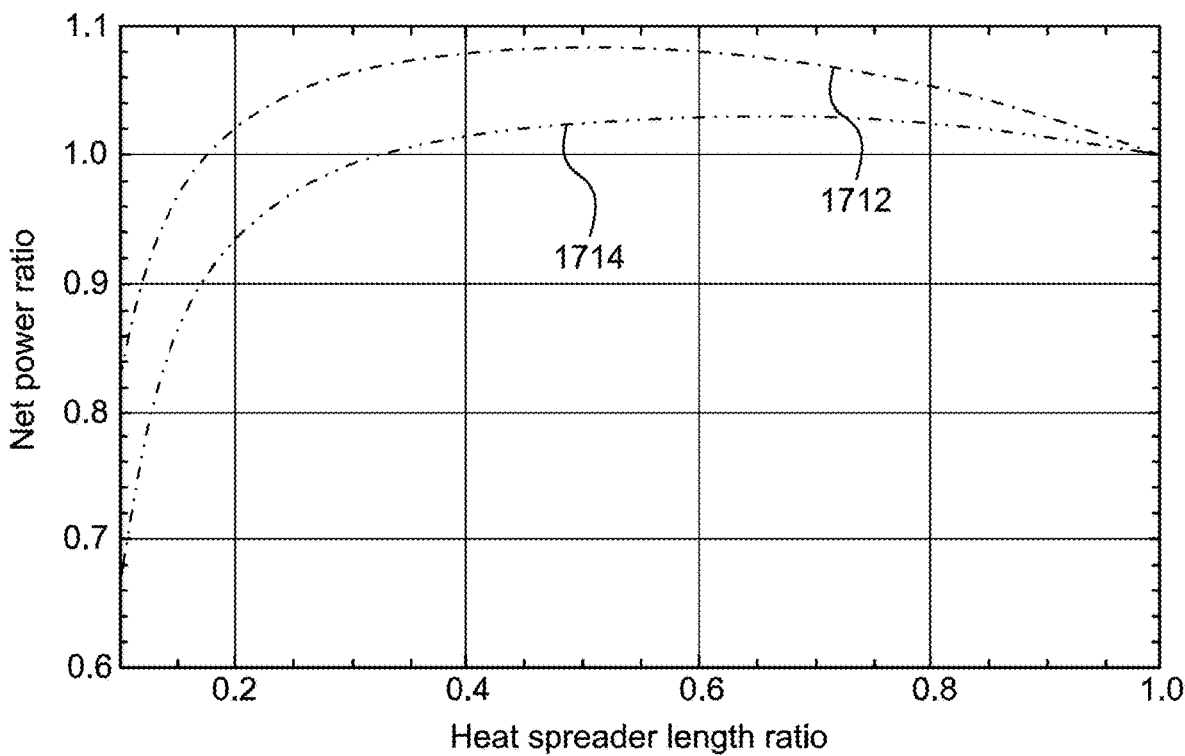
FIG. 17B is a net power ratio as a function of the backplate pad length for the two cities at t=0.004 mm, according to aspects of the present disclosure.
Figure 17C:
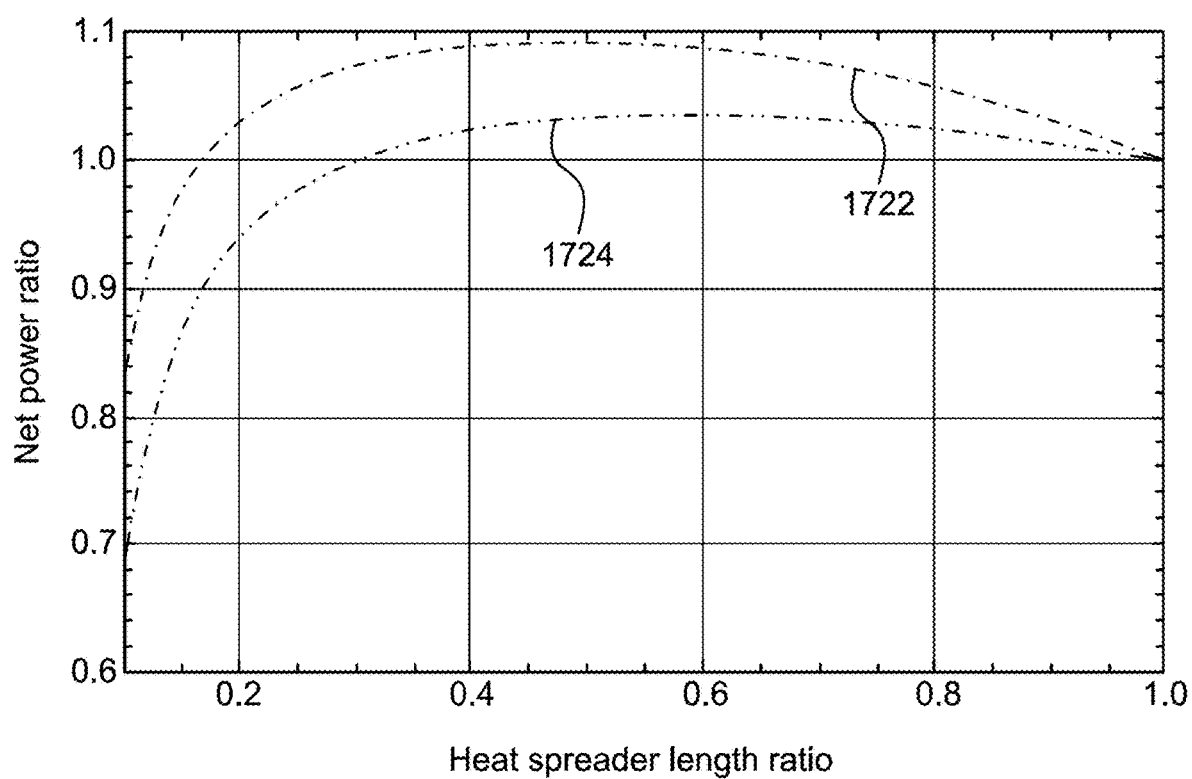
FIG. 17C is a net power ratio as a function of the backplate pad length for the two cities at t=0.006 mm, according to aspects of the present disclosure.

The net power ratio as a function of the backplate pad length at 1500 suns is shown in FIGS. 17A-17C for backplate pad thicknesses=2, 4, and 6 mm, respectively. FIG. 17A is a net power ratio as a function of the backplate pad length for the two cities at t=0.002 mm. Signal 1702 shows the net power ratio as a function of the backplate pad length for Dammam. Signal 1704 shows the net power ratio as a function of the backplate pad length for Riyadh. FIG. 17B is a net power ratio as a function of the backplate pad length for the two cities at t=0.004 mm. Signal 1712 shows the net power ratio as a function of the backplate pad length for Dammam. Signal 1714 shows the net power ratio as a function of the backplate pad length for Riyadh. FIG. 17C is a net power ratio as a function of the backplate pad length for the two cities at t=0.006 mm. Signal 1722 shows the net power ratio as a function of the backplate pad length for Dammam. Signal 1724 shows the net power ratio as a function of the backplate pad length for Riyadh.

Figure 18A:
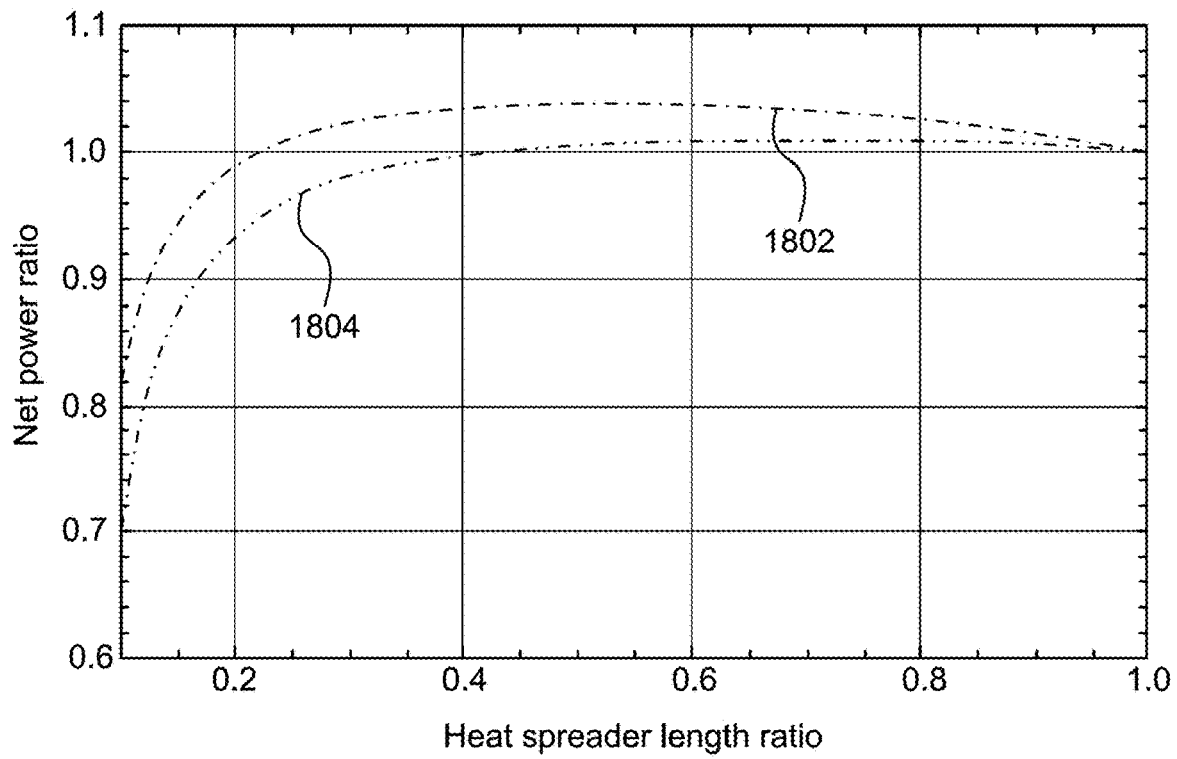
FIG. 18A is a net power ratio as a function of the backplate pad length for the two cities at CR=500, according to aspects of the present disclosure.
Figure 18B:
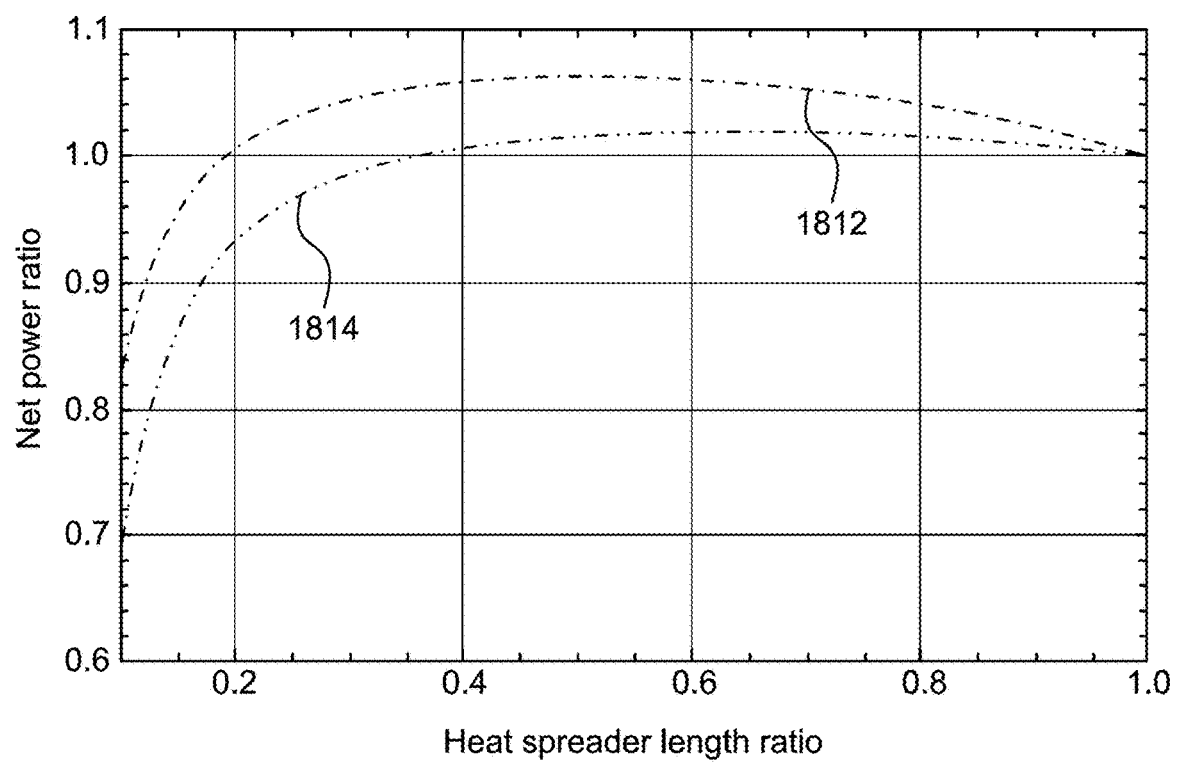
FIG. 18B is a net power ratio as a function of the backplate pad length for the two cities at CR=1000, according to aspects of the present disclosure.
Figure 18C:
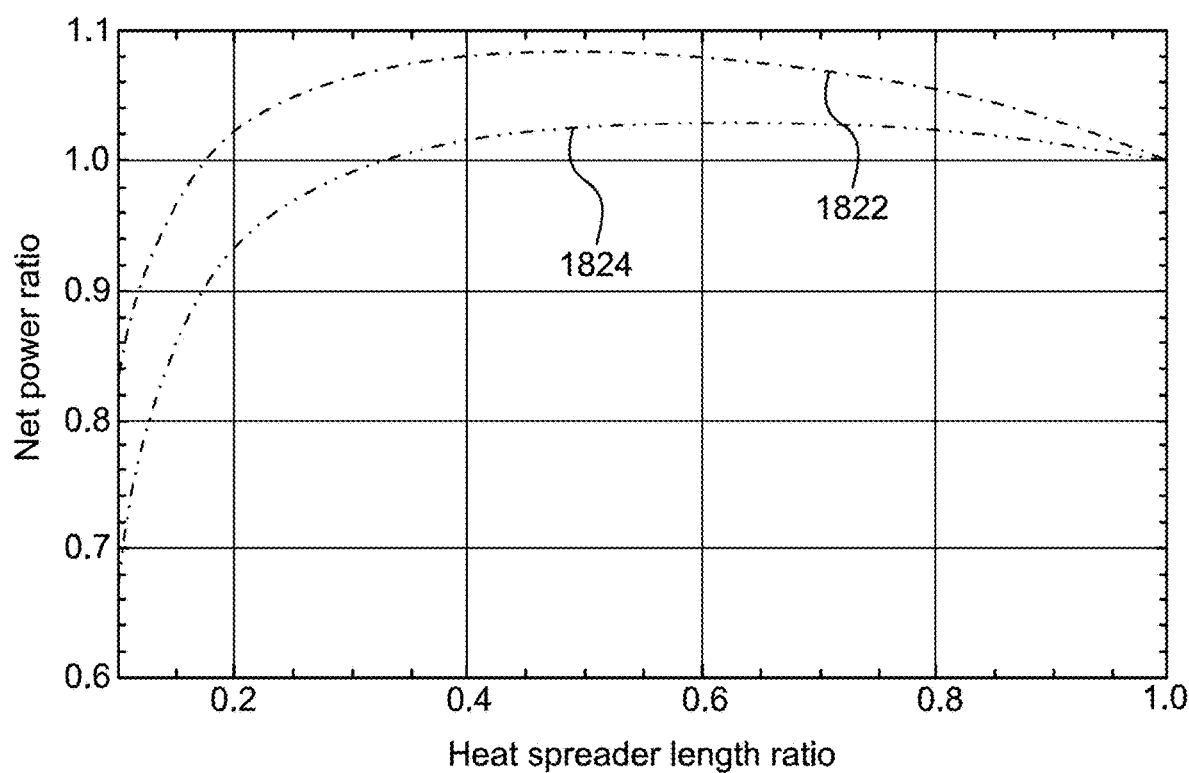
FIG. 18C is a net power ratio as a function of the backplate pad length for the two cities at CR=1500, according to aspects of the present disclosure.

FIGS. 17A-17C and FIGS. 18A-18C show that the backplate pad length at which the HCPV system 200 produced the highest net power was independent of both the backplate pad thickness and the concentration ratio (CR); however, the maximum net power increased by increasing the thickness of the backplate pad and the concentration ratio (CR). Also, FIGS. 17A-17C and FIGS. 18A-18C show that the backplate pad length ratios at which the highest net power was produced were ~0.8 and ~0.6 for Riyadh and Dammam, respectively. The net power ratio, at t=4 mm, is shown in FIGS. 18A-18C for CR=500, 1000, and 1500, respectively. FIG. 18A is a net power ratio as a function of the backplate pad length for the two cities at CR=500. Signal 1802 shows the net power ratio as a function of the backplate pad length for Dammam. Signal 1804 shows the net power ratio as a function of the backplate pad length for Riyadh.

FIG. 18B is a net power ratio as a function of the backplate pad length for the two cities at CR=1000. Signal 1812 shows the net power ratio as a function of the backplate pad length for Dammam. Signal 1814 shows the net power ratio as a function of the backplate pad length for Riyadh.

FIG. 18C is a net power ratio as a function of the backplate pad length for the two cities at CR=1500. Signal 1822 shows the net power ratio as a function of the backplate pad length for Dammam. Signal 1824 shows the net power ratio as a function of the backplate pad length for Riyadh.

Figure 19A:
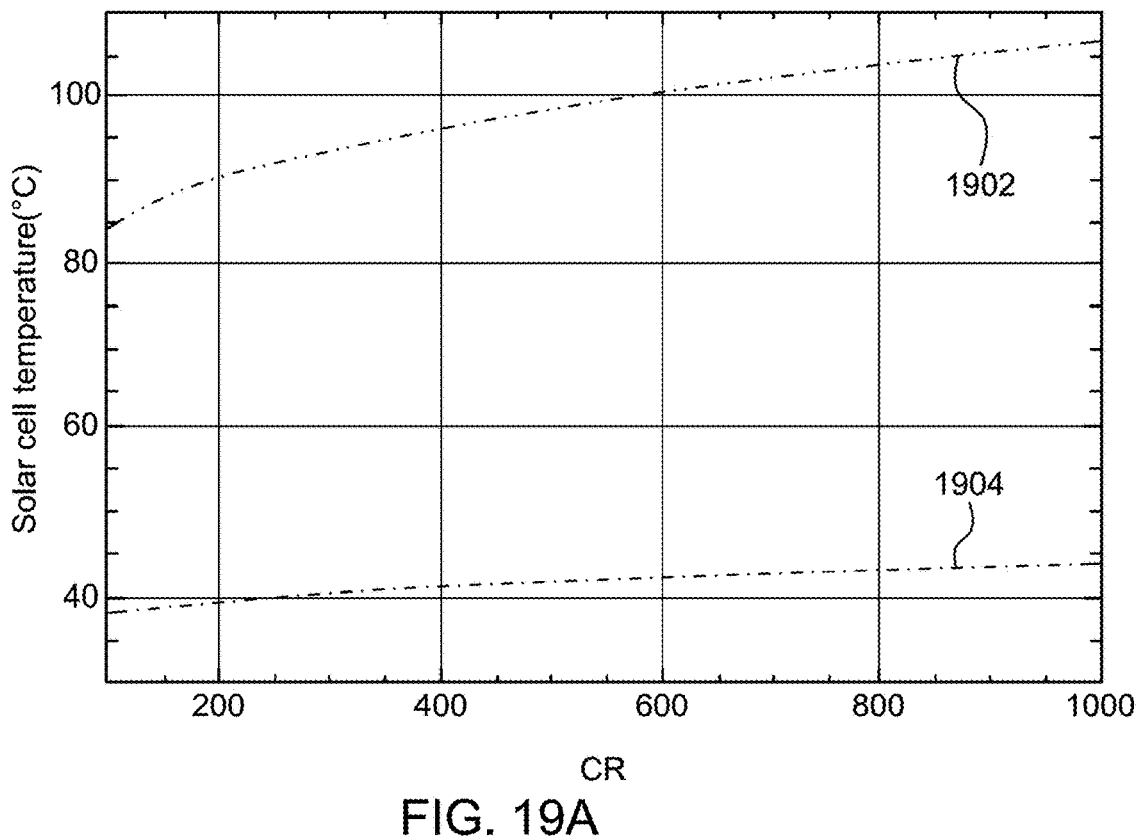
FIG. 19A is an operating temperature of the HCPV system at maximum and average meteorological conditions for $b_r$=0.6, according to aspects of the present disclosure.

The operating temperature of the solar cell of the system located in Dammam under the worst and average values of meteorological data is shown in FIG. 19A for a backplate pad length ratio of 0.6. FIG. 19A is an operating temperature

TABLE 1

Riyadh and Dammam average and maximum metrological data

|  | Average direct normal irradiance | Maximum direct normal irradiance | Average wind speed | Average wind direction | Minimum wind speed | Average ambient temperature | Maximum ambient temperature |
|---|---|---|---|---|---|---|---|
| Riyadh | 437.9 W/m² | 1043 W/m² | 2.1 m/s | 32° | 0.3 m/s | 303.6° C. | 47.3° C. |
| Dammam | 428 W/m² | 1011 W/m² | 3.46 m/s | 8.7° | 0.3 m/s | 303.6° C. | 46.1° C. |

Table 1 shows that Riyadh had a slightly higher average irradiance than Dammam. However, the average wind speed in Dammam was much higher than that in Riyadh. Because of the HCPV system 200 at maximum and average meteorological conditions for $b_r$=0.6. Signal 1902 shows the operating temperature for Dammam at worst condition.

Figure 19B:
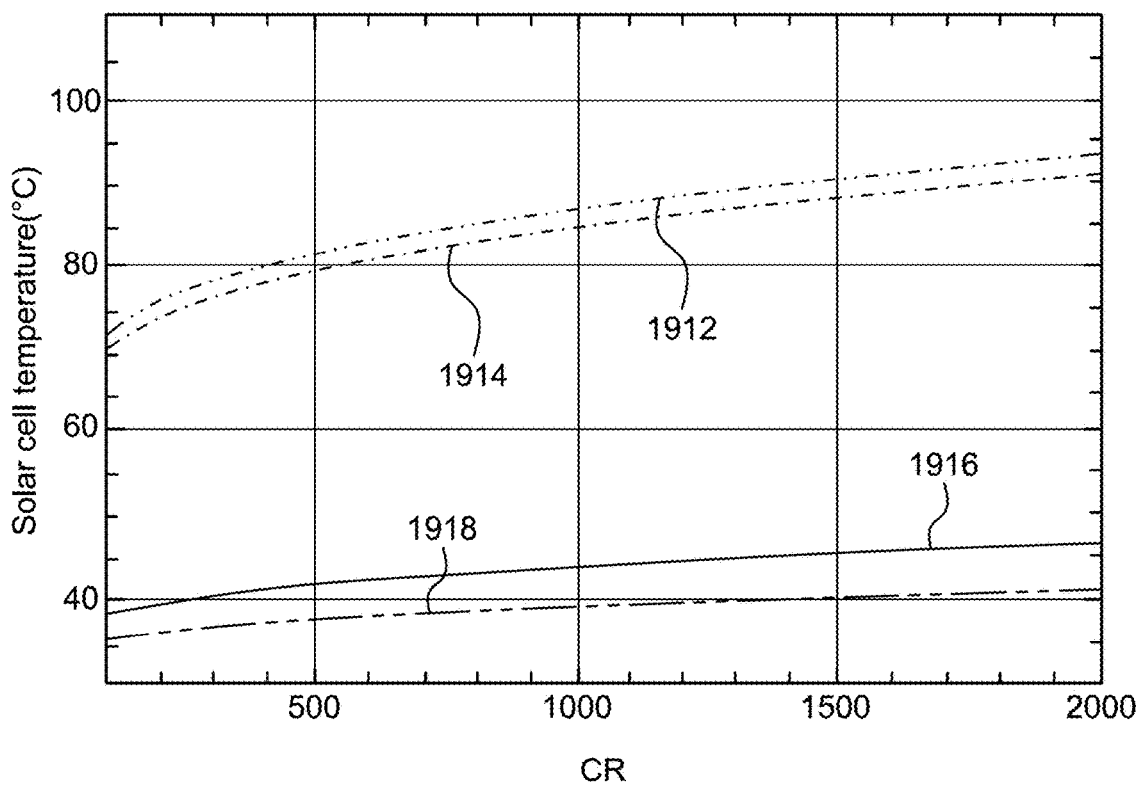
FIG. 19B is an operating temperature of the HCPV system at maximum and average meteorological conditions for $b_r$=0.8, according to aspects of the present disclosure.

Signal 1904 shows the operating temperature for Dammam at average values. FIGS. 19A-19B show that the maximum concentration ratio (CR) at which the system operated below the maximum temperature limit was 1000. The FIGS. 19A-19B also show that the operating temperature of the solar cell was consistently below 45° C. when average meteorological values were considered. However, the maximum concentration ratio (CR) at which the system operated below the maximum temperature limit was 2000 in Riyadh and Dammam for a backplate pad length ratio of 0.8 as shown in FIG. 19B. FIG. 19B is an operating temperature of the HCPV system at maximum and average meteorological conditions for $b_r=0.8$. Signal 1912 shows the operating temperature for Riyadh at worst condition. Signal 1914 shows the operating temperature for Dammam at worst condition. Signal 1916 shows the operating temperature for Riyadh at average values. Signal 1918 shows the operating temperature for Dammam at average values. FIGS. 19A-19B also show that the system's average operating temperature at a 0.8 backplate pad length ratio is always below 50° C. in Riyadh and Dammam for CR≤2000. The design parameters of an HCPV system in Riyadh and Dammam are shown in Table 2.

TABLE 2

Parameters for an HCPV system in Riyadh and Dammam cities

| | Backplate Pad length ratio | Maximum Concentration ratio (CR) | Average Operating temperature | Reduction in backplate pad size | Enhancement in net power |
|---|---|---|---|---|---|
| Riyadh | 0.8 | 2000 | Below 47° C. | 36% | 2.6% |
| Dammam | 0.8 | 2000 | Below 42° C. | 36% | 6% |
| | 0.6 | 1000 | Below 45° C. | 64% | 8.5% |

Cost Analysis

A cost analysis was carried out by comparing the cost of the system 100 with the present HCPV system 200. The cost analysis took into consideration the installation, materials, and labor cost. The details of the cost analysis are as provided in Table 3.

| Sr. no. | Component description | Cost $ (SR) Traditional | Cost $ (SR) Present |
|---|---|---|---|
| 1 | Solar cells assembly | 23,000 (86,250) | 23,000 (86,250) |
| 2 | Fresnel lens | 5,000 (18,750) | 5,000 (18,750) |
| 3 | Module frame | 54 (200) | 40 (150) |
| 4 | Backplate array | 107 (400) | 68 (256) |
| 5 | Adhesive for installation | 534 (2,000) | 534 (2,000) |
| 6 | Power inverter | 190 (700) | 190 (700) |
| 7 | Tracker | 37,350 (140,000) | 29,300 (110,000) |
| 8 | Installation | 4000 (15,000) | 3200 (12,000) |
| Total | | 70,235 | 61,332 |
| Percentage saving | | | −12.7% |

It is evident from Table 3 that the present HCPV system 200 reduces the initial cost of the module by 13%. This reduction in cost is further enhanced by the increase in power production by up to 6% for the Dammam region in Saudi Arabia. Hence, it can be concluded that the present HCPV module 300 has economic benefits compared to traditional HCPV modules.

In an aspect, the HCPV system of the present disclosure is configured to provide the electric conversion efficiency and output power of the HCPV system 200. It is evident from the experiments that many environmental and material parameters affect solar cell efficiency and maximum power, including metrological conditions and system components properties. There are four governing parameters, namely backplate pad emissivity, wind velocity, backplate pad thickness, and backplate pad length, are highly impactful in increasing solar cell efficiency. Further, it is evident that the performance of the solar cell 208 in high-concentration operations strongly depends on its temperature. Therefore, the present disclosure develops an analytical model for an HCPV cell temperature, efficiency, and net power in terms of various parameters.

In an aspect, the backplate pad material emissivity increases solar cell efficiency and maximum power produced.

Further, higher wind speeds ventilate the HCPV system 200 and help increase cell efficiency by reducing cell temperature.

It is concluded from the experiments that the thicker the backplate pad, the higher the cell power and efficiency. However, the rate of power increase flattened after 4 mm thickness, and no detectible increase in efficiency was noted for thicknesses above 8 mm.

It is proved from the experiments that the consumed power due to the operation of the tracking system is highly dependent on backplate pad length and wind velocity.

It is evident from the experiments that the moderate and high values of wind speed and length of the backplate pad at which net power is maximum were found.

The embodiment describes the HCPV system 200. The HCPV system 200 includes a plurality of modules 202 connected to form an array, a casing 206, a plurality of inverted pyramids 204, a plurality of solar cells 208, and a backplate array 210. Each module 202 comprises an optical component 212 that concentrates light onto a corresponding solar cell 208. Each inverted pyramid 204 has solid lateral faces and connects the optical component 212 at a peripheral edge of a base of the pyramid 204 to a corresponding solar cell at an apex of the inverted pyramid. The casing 206 has a top frame 214 and a bottom frame 216. The top frame 214 surrounds the array at its periphery, and the bottom frame 216 surrounds the array at its periphery. The top frame 214 and bottom frame 216 are separated by a plurality of supports. The backplate array 210 is a plurality of interconnected circular pads 218. Each pad 218 includes a corresponding solar cell 208 arranged in a center portion of the pad 218. The plurality of circular pads 218 is interconnected by a grid structure 220. The grid structure 220 connects the plurality of circular pads to the bottom frame 216; and each of the singular solar cells are adiabatically separated from one another.

In an aspect, each solar cell 208 of the plurality of solar cells is a triple-junction solar cell. In another aspect, each triple-junction solar cell has a length and a width of 5 mm to 10 mm. In an example, each triple-junction solar cell has a length and a width of 1 mm to 5 mm.

In an aspect, the optical component 212 is a Fresnel lens. In an example, each Fresnel lens has a length and a width at least 200 mm.

In an aspect, a number of the plurality of solar cells 208 is at least 25 and there are at least 5 solar cells in a row on the backplate array.

In an aspect, a number of the plurality of inverted pyramids 204 is at least 25.

In an aspect, a number of the plurality of circular pads 218 is at least 25.

In an aspect, the thickness of the singular circular pad 218 is 1 mm to 5 mm.

In another aspect, the thickness of the singular circular pad 218 is 5 mm to 10 mm.

In an aspect, each Fresnel lens 212 has a thermal coating layer. In an aspect, an emissivity of the coating layer is of from 0.9 to 0.97. In another aspect, the emissivity of the coating layer is of from 0.5 to 0.6.

In an aspect, a length of an interconnected circular pad of the backplate array 210 is from 0.02 m to 0.06 m.

In an aspect, a ratio of the length of an interconnected circular pad of the backplate array to half a length of a Fresnel lens is 0.6 to 0.7. In another aspect, the ratio of the length of the backplate to half a length of a Fresnel lens is 0.7 to 0.8.

In an aspect, an interconnected circular pad of the backplate array 210 has a thermal conductivity of 200 W/mK to 400 W/mK. In another aspect, each Fresnel lens has an optical efficiency of from 0.8 to 0.9. In an aspect, the backplate array is in a shape of a square.

The above-described hardware description is a non-limiting example of corresponding structure for performing the functionality described herein.

Obviously, numerous modifications and variations of the present disclosure are possible in light of the above teachings. It is therefore to be understood that within the scope of the appended claims, the invention may be practiced otherwise than as specifically described herein.

The invention claimed is:

1. A high-concentrating photovoltaic (HCPV) system with backplate support, comprising:
    a plurality of modules connected to form a module array;
    a casing;
    a plurality of inverted pyramids;
    a plurality of solar cells; and
    a backplate array comprising a plurality of interconnected circular pads interconnected by a grid structure, wherein all of the interconnected circular pads are coplanar; wherein:
    each module comprises one inverted pyramid of the plurality of inverted pyramids, one solar cell of the plurality of solar cells, and an optical component that concentrates light onto the corresponding solar cell of the plurality of solar cells;
    wherein each inverted pyramid has solid lateral faces and connects the optical component at a peripheral edge of a base of the pyramid to a corresponding solar cell of the plurality of solar cells at a plane formed at a truncation of the inverted pyramid at a height of 1-7% of the height of the inverted pyramid at an apex thereof; and
    the casing has a top frame and a bottom frame; wherein:
    the top frame surrounds a periphery of the module array;
    the bottom frame surrounds a periphery of the backplate array; and
    the top frame and bottom frame are connected by a plurality of supports;
    wherein each solar cell is arranged in a center portion of a corresponding interconnected circular pad of the backplate array;
    each optical component is a Fresnel lens that is configured to concentrate light onto a corresponding solar cell;
    a ratio of a diameter of the interconnected circular pad of the backplate array to half a length of a corresponding Fresnel lens is 0.6 to 0.8;
    the grid structure connects the plurality of interconnected circular pads to the bottom frame; and
    each solar cell of the plurality of solar cells is adiabatically separated from one another.

2. The system of claim 1, wherein each solar cell of the plurality of solar cells is a triple-junction solar cell.

3. The system of claim 2, wherein the each triple-junction solar cell has a length and a width of 5 mm to 10 mm.

4. The system of claim 2, wherein each triple-junction solar cell has a length and a width of 1 mm to 5 mm.

5. The system of claim 1, wherein each Fresnel lens has a length and a width of at least 200 mm.

6. The system of claim 1, wherein the number of the plurality of solar cells is at least 25 and there are at least 5 solar cells in a row on the module array.

7. The system of claim 1, wherein the number of the plurality of inverted pyramids is at least 25.

8. The system of claim 7, wherein the number of the interconnected circular pads is at least 25.

9. The system of claim 1, wherein a thickness of the interconnected circular pad is 1 mm to 5 mm.

10. The system of claim 1, wherein a thickness of the interconnected circular pad is 5 mm to 10 mm.

11. The system of claim 1, wherein each Fresnel lens has a thermal coating layer.

12. The system of claim 11, wherein an emissivity of the thermal coating layer is 0.9 to 0.97.

13. The system of claim 11, wherein an emissivity of the thermal coating layer is 0.5 to 0.6.

14. The system of claim 1, wherein the diameter of an interconnected circular pad of the backplate array is from 0.02 m to 0.06 m.

15. The system of claim 14, wherein a ratio of the diameter of the interconnected circular pad of the backplate array to half a length of a corresponding Fresnel lens is 0.6 to 0.7.

16. The system of claim 14, wherein a ratio of the diameter of the interconnected circular pad of the backplate array to half a length of a corresponding Fresnel lens is 0.7 to 0.8.

17. The system of claim 1, wherein the interconnected circular pad of the backplate array has a thermal conductivity of 200 W/mK to 400 W/mK.

18. The system of claim 1, wherein each Fresnel Lens has an optical efficiency of 0.8 to 0.9.

19. The system of claim 1, wherein the backplate array is in a shape of a square.

* * * * *